(12) United States Patent
Kawamura

(10) Patent No.: US 9,748,664 B2
(45) Date of Patent: Aug. 29, 2017

(54) SEMICONDUCTOR DEVICE, TRANSMISSION SYSTEM, METHOD FOR MANUFACTURING SEMICONDUCTOR DEVICE, AND METHOD FOR MANUFACTURING TRANSMISSION SYSTEM

(71) Applicant: Sony Corporation, Tokyo (JP)

(72) Inventor: Hirofumi Kawamura, Chiba (JP)

(73) Assignee: SONY CORPORATION, Tokyo (JP)

(*) Notice: Subject to any disclaimer, the term of this patent is extended or adjusted under 35 U.S.C. 154(b) by 232 days.

(21) Appl. No.: 14/487,711

(22) Filed: Sep. 16, 2014

(65) Prior Publication Data
US 2015/0002360 A1  Jan. 1, 2015

Related U.S. Application Data

(62) Division of application No. 12/720,237, filed on Mar. 9, 2010, now abandoned.

(30) Foreign Application Priority Data

Mar. 16, 2009 (JP) ................................ 2009-063564

(51) Int. Cl.
*H01Q 21/00* (2006.01)
*H01L 23/66* (2006.01)
(Continued)

(52) U.S. Cl.
CPC ......... *H01Q 21/0075* (2013.01); *H01L 23/66* (2013.01); *H01L 24/06* (2013.01);
(Continued)

(58) Field of Classification Search
CPC ..... H01Q 21/0075; H01L 23/66; H01L 24/06; H01L 24/49
(Continued)

(56) References Cited

U.S. PATENT DOCUMENTS 3,778,717 A * 12/1973 Okoshi ................... H01Q 1/22
  331/107 SL
6,489,679 B2 * 12/2002 Tsukiyama .............. H01L 23/66
  257/691

(Continued)

FOREIGN PATENT DOCUMENTS

EP    0200291    11/1986
EP    1241730    9/2002
(Continued)

OTHER PUBLICATIONS

European Search Report issued in corresponding European Patent Application No. 10002328.2 dated Jun. 15, 2010.
(Continued)

*Primary Examiner* — Dameon E Levi
*Assistant Examiner* — David Lotter
(74) *Attorney, Agent, or Firm* — Chip Law Group

(57) ABSTRACT

Disclosed herein is a semiconductor device including: a semiconductor circuit element configured to process an electrical signal having a predetermined frequency; and a transmission line configured to be connected to the semiconductor circuit element via a wire and transmit the electrical signal. An impedance matching pattern having a symmetric shape with respect to a direction of the transmission line is provided in the transmission line.

8 Claims, 21 Drawing Sheets

(51) Int. Cl.
*H01L 23/00* (2006.01)
*H01P 1/04* (2006.01)
*H01P 5/08* (2006.01)
*H05K 1/02* (2006.01)

(52) U.S. Cl.
CPC .............. *H01L 24/49* (2013.01); *H01P 1/047* (2013.01); *H01P 5/08* (2013.01); *H05K 1/025* (2013.01); *H01L 24/48* (2013.01); *H01L 2223/6611* (2013.01); *H01L 2223/6627* (2013.01); *H01L 2223/6633* (2013.01); *H01L 2223/6677* (2013.01); *H01L 2224/05554* (2013.01); *H01L 2224/05624* (2013.01); *H01L 2224/05647* (2013.01); *H01L 2224/32225* (2013.01); *H01L 2224/48091* (2013.01); *H01L 2224/48227* (2013.01); *H01L 2224/49171* (2013.01); *H01L 2224/49175* (2013.01); *H01L 2224/73265* (2013.01); *H01L 2924/00014* (2013.01); *H01L 2924/01004* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01082* (2013.01); *H01L 2924/181* (2013.01); *H01L 2924/19032* (2013.01); *H01L 2924/19039* (2013.01); *H01L 2924/3011* (2013.01); *H01L 2924/30111* (2013.01); *H05K 1/0219* (2013.01); *H05K 1/0243* (2013.01); *H05K 2201/09727* (2013.01); *H05K 2201/10166* (2013.01); *H05K 2203/049* (2013.01)

(58) Field of Classification Search
USPC ................ 343/700 MS, 853; 333/81 A, 81 B
See application file for complete search history.

(56) References Cited

U.S. PATENT DOCUMENTS

| | | | |
|---|---|---|---|
| 6,677,837 B2 * | 1/2004 | Kojima | H01P 1/2088 333/134 |
| 7,212,088 B1 | 5/2007 | Norregaard et al. | |
| 7,381,964 B1 * | 6/2008 | Kump | A61B 6/542 250/370.09 |
| 8,274,307 B1 * | 9/2012 | Ben Artsi | H01P 3/026 326/30 |
| 2003/0062962 A1 | 4/2003 | Fujidai et al. | |
| 2004/0050587 A1 | 3/2004 | Tsukashima | |
| 2005/0237126 A1 | 10/2005 | Babb et al. | |
| 2007/0285190 A1 * | 12/2007 | Mukaiyama | H01P 3/023 333/161 |
| 2008/0039585 A1 * | 2/2008 | Nishioka | C08L 9/06 525/187 |
| 2008/0211604 A1 | 9/2008 | Katayama et al. | |

FOREIGN PATENT DOCUMENTS

| | | | |
|---|---|---|---|
| EP | 1351301 | 10/2003 | |
| EP | 2117070 | 11/2008 | |
| JP | 10-093312 | 4/1998 | |
| JP | 2001-102820 | 4/2001 | |
| JP | 2006-180337 | 7/2006 | |
| WO | WO 2004/075336 | 9/2004 | |
| WO | 2006033204 | * 3/2006 | ............... H03B 5/18 |
| WO | WO 2006/033204 | 3/2006 | |
| WO | WO 2008/093697 | 8/2008 | |

OTHER PUBLICATIONS

Japanese Office Action issued in Japanese counterpart Japanese Patent Application No. 2009-063564 dated Dec. 25, 2012.

* cited by examiner

SEMICONDUCTOR DEVICE, TRANSMISSION SYSTEM, METHOD FOR MANUFACTURING SEMICONDUCTOR DEVICE, AND METHOD FOR MANUFACTURING TRANSMISSION SYSTEM

RELATED APPLICATION DATA

This application is a division of U.S. patent application Ser. No. 12/720,237 filed Mar. 9, 2010, the entirety of which is incorporated herein by reference to the extent permitted by law. The present application claims the benefit of priority to Japanese Patent Application No. JP 2009-063564 filed on Mar. 16, 2009 in the Japan Patent Office, the entirety of which is incorporated by reference herein to the extent permitted by law.

BACKGROUND OF THE INVENTION

1. Field of the Invention

The present invention relates to a semiconductor device, a transmission system, a method for manufacturing a semiconductor device, and a method for manufacturing a transmission system that allow high-speed data transmission by use of an electrical signal having a millimeter-wave frequency.

2. Description of the Related Art

In recent years, demands for high-speed data transmission for transmitting large-volume data such as moving image data at high speed are increasing. For such high-speed data transmission, there is a method of using an electrical signal having a millimeter-wave frequency as one of high-frequency signals.

For example, an oscillating circuit in which a resonant electrode is formed in a resonator is disclosed in PCT Patent Publication No. WO2006/33204 (FIG. 1 and FIG. 8, hereinafter Patent Document 1). In this oscillating circuit, the resonant electrode is formed in the resonator and the resonator and a transmission line provided on a circuit board are connected to each other by a bonding wire. By this resonator, a resonant frequency in the range of 22 GHz to 26 GHz can be achieved.

FIG. 23 is a perspective view showing a configuration example of a semiconductor device 100 of a related art. FIG. 24 is a plan view showing a configuration example of a major part of the semiconductor device 100, and FIG. 25 is a front view thereof. As shown in FIGS. 23 to 25, the semiconductor device 100 includes a circuit board 10 serving as a semiconductor circuit element that processes an electrical signal having a millimeter-wave frequency, and an interposer substrate (hereinafter, referred to as the substrate 17) having a transmission line 14 that transmits the electrical signal processed by the circuit board 10.

The circuit board 10 has a terminal unit 11 composed of a signal transmission terminal 11a and grounding terminals 11b. The substrate 17 has a terminal unit 13 composed of a signal transmission terminal 13a and grounding terminals 13b. The signal transmission terminal 11a is connected to the signal transmission terminal 13a via a wire 12a included in a wire unit 12. The grounding terminals 11b are connected to the grounding terminals 13b via wires 12b included in the wire unit 12.

The substrate 17 has a first dielectric layer (hereinafter, referred to as the dielectric layer 17a), a grounding layer 17b, and a second dielectric layer (hereinafter, referred to as the dielectric layer 17c). The grounding layer 17b is formed of copper or aluminum and has a function for grounding. Vias 19 having electrical conductivity are provided in the dielectric layer 17a at the positions on which the grounding terminals 13b are provided. The semiconductor device 100 is grounded by electrical connection between the grounding terminals 13b and the grounding layer 17b through the vias 19. The dielectric layer 17a has a predetermined dielectric constant. The dielectric layer 17a, the transmission line 14, and the grounding layer 17b form a micro-strip line. The dielectric layer 17c has a function to support the dielectric layer 17a and the grounding layer 17b.

The transmission line 14 is connected to the signal transmission terminal 13a, and this transmission line 14 transmits a millimeter-wave electrical signal in a predetermined direction (in FIGS. 24 and 25, in the right direction). An antenna part 16 is connected to the transmission line 14, and the antenna part 16 converts the millimeter-wave electrical signal to an electromagnetic wave signal. The semiconductor device 100 is sealed by a sealing resin 18 in such a way that an upper part of the substrate 17 is covered.

The millimeter-wave electrical signal resulting from signal processing by the circuit board 10 is transmitted by the transmission line 14 on the substrate 17 via the wire 12a. The transmitted millimeter-wave electrical signal is changed to the electromagnetic wave signal by the antenna part 16, and the electromagnetic wave signal passes through the sealing resin 18 to be output to the external.

A simulation result relating to the millimeter-wave signal transmission by the semiconductor device 100 will be described below. FIG. 26 is a graph showing a characteristic example of the semiconductor device 100, obtained by the simulation. As shown in FIG. 26, this simulation result is represented by plotting the frequency (GHz) of the millimeter-wave electrical signal on the abscissa and plotting the S-parameter magnitude (dB) on the ordinate, and is obtained by calculation with use of the semiconductor device 100 shown in FIGS. 23 to 25 based on parameters shown in Table 1. The S-parameter magnitudes refer to the parameter magnitudes representing the transfer and reflection of the millimeter-wave electrical signal. The full lines in FIG. 26 indicate transfer characteristics S12 and S21, and the dashed lines indicate reflection characteristics S11 and S22.

TABLE 1

| | |
|---|---|
| Thickness A1 of transmission line 14 | 18 μm |
| Width A2 of transmission line 14 | 130 μm |
| Length A3 of transmission line 14 | 2 mm |
| Thickness A5 of dielectric layer 17a | 70 μm |
| Relative dielectric constant of dielectric layer 17a | 4.7 |
| Dissipation factor of dielectric layer 17a | 0.02 |
| Relative dielectric constant of sealing resin 18 | 4.2 |
| Dissipation factor of sealing resin 18 | 0.02 |
| Length of wire 12a | 635 μm |
| Length of wire 12b | 711 μm |

As shown in Table 1, in this simulation, the width A2 and the length A3 of the transmission line 14, shown in FIG. 24, are set to 130 μm and 2 mm, respectively. Referring to FIG. 25, the thickness A1 of the transmission line 14 is set to 18 μm, and the thickness A5 of the dielectric layer 17a in the substrate 17 is set to 70 μm. Furthermore, the relative dielectric constant and the dissipation factor of the dielectric layer 17a are set to 4.7 and 0.02, respectively. The relative dielectric constant and the dissipation factor of the sealing resin 18 are set to 4.2 and 0.02, respectively. The lengths of the wire 12a and the wire 12b are set to 635 μm and 711 μm, respectively.

According to this simulation result, the S-parameter magnitudes of the transfer characteristics S12 and S21 are lower than those of the reflection characteristics S11 and S22 over the frequency range of the millimeter-wave electrical signal from 40 GHz to 80 GHz. This indicates that the data transmission is difficult when the frequency of the millimeter-wave electrical signal is in the frequency band from 40 GHz to 80 GHz.

SUMMARY OF THE INVENTION

By the technique of Patent Document 1, a resonant frequency in the range of 22 GHz to 26 GHz can be obtained by the resonator. However, a resonant frequency beyond this range can not be obtained. Furthermore, for the semiconductor device 100 of the related art, data transmission is difficult in the frequency band from 40 GHz to 80 GHz.

There is a desire for the present invention to allow enhancement in the transmission characteristic of an electrical signal having a frequency in a frequency band over 40 GHz, and provide a semiconductor device, a transmission system, a method for manufacturing a semiconductor device, and a method for manufacturing a transmission system that allow high-speed data transmission involving little signal deterioration.

According to an embodiment of the present invention, there is provided a semiconductor device including a semiconductor circuit element configured to process an electrical signal having a predetermined frequency, and a transmission line configured to be connected to the semiconductor circuit element via a wire and transmit the electrical signal. In the semiconductor device, an impedance matching pattern having a symmetric shape with respect to the direction of the transmission line is provided in the transmission line.

In the semiconductor device according to the embodiment of the present invention, the semiconductor circuit element processes the electrical signal having the predetermined frequency. The transmission line is connected to the semiconductor circuit element via the wire and transmits the electrical signal. On the premise of this configuration, the impedance matching pattern having a symmetric shape with respect to the direction of the transmission line is provided in the transmission line. Due to this feature, impedance matching of the transmission line is achieved by the impedance matching pattern, which makes it possible to reduce reflection of the electrical signal that is transmitted through this transmission line and has the predetermined frequency.

According to another embodiment of the present invention, there is provided a transmission system including a first semiconductor device configured to include a first semiconductor circuit element that processes an electrical signal having a predetermined frequency, a first transmission line that is connected to the first semiconductor circuit element via a wire and transmits the electrical signal, and a first antenna part that converts the electrical signal transmitted from the first transmission line to an electromagnetic wave signal and sends the electromagnetic wave signal. The transmission system further includes a second semiconductor device configured to include a second antenna part that receives the electromagnetic wave signal sent from the first antenna part and converts the electromagnetic wave signal to an electrical signal having the predetermined frequency, a second transmission line that transmits the electrical signal arising from conversion by the second antenna part, and a second semiconductor circuit element that is connected to the second transmission line via a wire and processes the electrical signal transmitted by the second transmission line.

In the semiconductor device, impedance matching patterns having symmetric shapes with respect to the directions of the first and second transmission lines are provided in the first and second transmission lines.

According to further another embodiment of the present invention, there is provided a method for manufacturing a semiconductor device. The method includes the steps of forming a semiconductor circuit element that processes an electrical signal having a predetermined frequency, forming, on a substrate, a transmission line that transmits the electrical signal and an impedance matching pattern having a symmetric shape with respect to the direction of the transmission line, setting the semiconductor circuit element on the substrate, and connecting the transmission line to the semiconductor circuit element via a wire.

According to further another embodiment of the present invention, there is provided a method for manufacturing a transmission system. The method includes the steps of fabricating a first semiconductor device, fabricating a second semiconductor device, and connecting the first semiconductor device to the second semiconductor device. The step of fabricating a first semiconductor device includes the sub-steps of forming a first semiconductor circuit element that processes an electrical signal having a predetermined frequency, forming, on a first substrate, a first transmission line that transmits the electrical signal and an impedance matching pattern having a symmetric shape with respect to the direction of the first transmission line, setting the first semiconductor circuit element on the first substrate, and connecting the first transmission line to the first semiconductor circuit element via a wire. The step of fabricating a second semiconductor device includes the sub-steps of forming a second semiconductor circuit element that processes an electrical signal having a predetermined frequency, forming, on a second substrate, a second transmission line that transmits the electrical signal and an impedance matching pattern having a symmetric shape with respect to the direction of the second transmission line, setting the second semiconductor circuit element on the second substrate, and connecting the second transmission line to the second semiconductor circuit element via a wire.

In the semiconductor device according to the embodiment of the present invention, impedance matching of the transmission line is achieved by the impedance matching pattern. Due to this feature, reflection of the electrical signal that is transmitted through this transmission line and has the predetermined frequency can be reduced, and thus the transmission characteristic of the electrical signal can be enhanced. This can provide a semiconductor device capable of high-speed data transmission involving little signal deterioration.

The transmission system according to the embodiment of the present invention includes the above-described semiconductor device. This can provide a transmission system capable of high-speed data transmission involving little signal deterioration.

In the method for manufacturing a semiconductor device and the method for manufacturing a transmission system according to the embodiments of the present invention, the transmission line that transmits the signal having the predetermined frequency and the impedance matching pattern having a symmetric shape with respect to the direction of this transmission line are formed on the same substrate. Therefore, the step of forming the impedance matching pattern can be carried out simultaneously with the step of forming the transmission line, and thus cost reduction can be achieved.

DETAILED DESCRIPTION OF THE PREFERRED EMBODIMENTS

Figure 1:
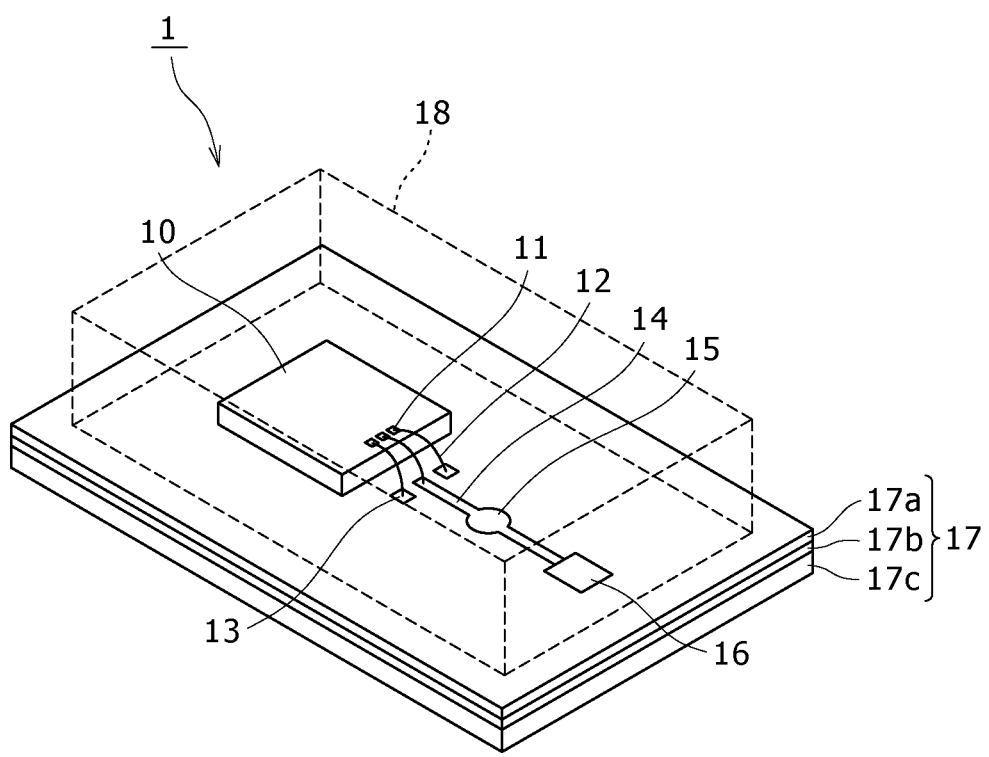
FIG. 1 is a perspective view showing a configuration example of a semiconductor device according to a first embodiment of the present invention.

Modes (hereinafter, referred to as embodiments) for carrying out the present invention will be described below. The description will be made in the following order.

1. First Embodiment (semiconductor device 1: configuration example, characteristic example, and manufacturing example)
2. Second Embodiment (semiconductor device 2: configuration example and characteristic example)
3. Third Embodiment (semiconductor device 3: configuration example and characteristic example)
4. Fourth Embodiment (semiconductor device 4: configuration example)
5. Fifth Embodiment (transmission system 5: configuration example)
6. Sixth Embodiment (transmission system 6: configuration example and assembly example)

First Embodiment

[Configuration Example of Semiconductor Device 1]

Figure 2:
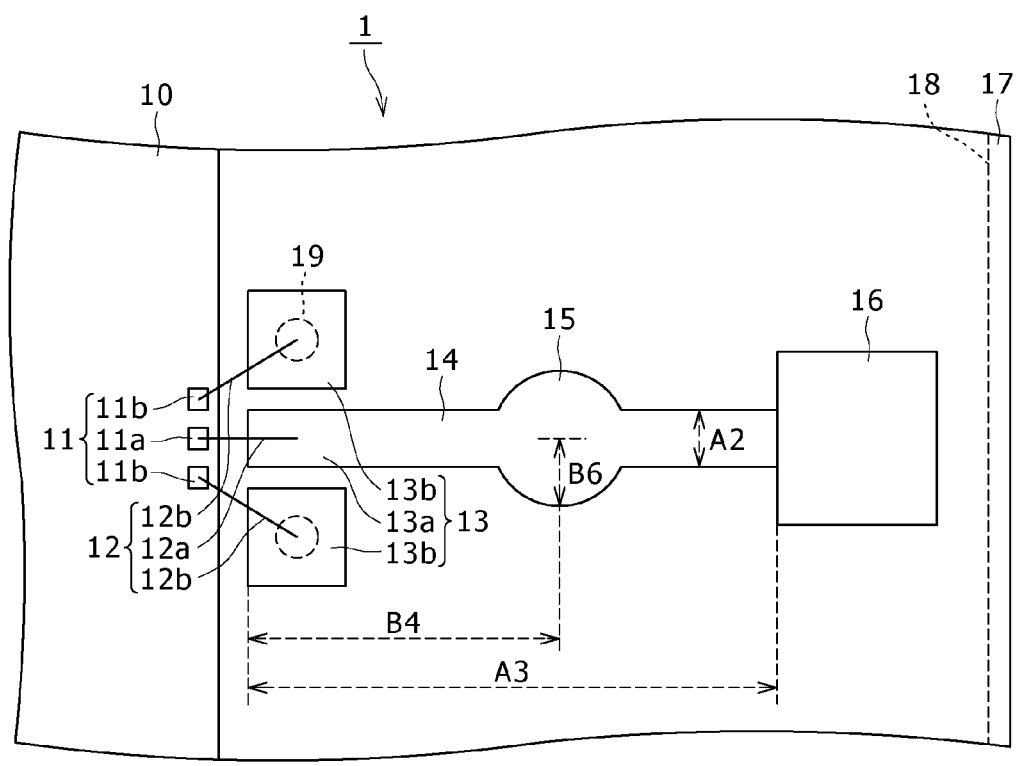
FIG. 2 is a plan view showing a configuration example of a major part of the semiconductor device.
Figure 3:
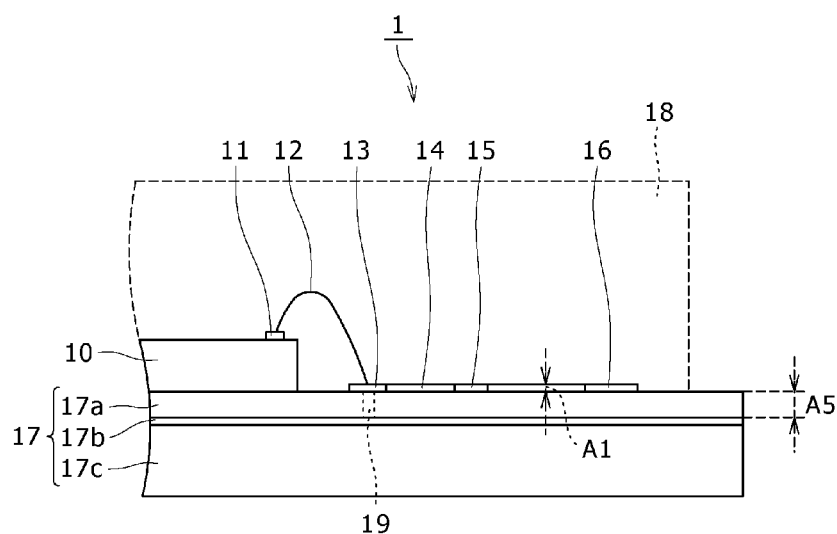
FIG. 3 is a side view showing the configuration example of the major part of the semiconductor device.

As shown in FIGS. 1 to 3, a semiconductor device 1 according to the present embodiment includes a circuit board 10 serving as a semiconductor circuit element that processes an electrical signal having a predetermined frequency, e.g. a frequency in the millimeter-wave band, and a transmission line 14 that is connected to the circuit board 10 via a wire unit 12 and transmits the electrical signal. In the transmission line 14, a resonant pattern 15 serving as an impedance matching pattern having a symmetric shape with respect to the direction of this transmission line is provided. The semiconductor device 1 further includes a substrate 17 on which the transmission line 14 and the resonant pattern 15 are formed.

The circuit board 10 has a terminal unit 11 composed of a signal transmission terminal 11a and grounding terminals 11b. The substrate 17 has a terminal unit 13 composed of a signal transmission terminal 13a and grounding terminals 13b serving as grounding electrodes. The signal transmission terminal 11a is connected to the signal transmission terminal 13a via a wire 12a included in the wire unit 12. The grounding terminals 11b are connected to the grounding terminals 13b via wires 12b included in the wire unit 12. The grounding terminals 13b are provided symmetrically with respect to the direction of the transmission line 14. This feature can stabilize the electrical signal transmitted through the transmission line 14.

The substrate 17 has a dielectric layer 17a, a grounding layer 17b, and a dielectric layer 17c. The grounding layer 17b is formed of copper or aluminum and has a function for grounding. Vias 19 having electrical conductivity are provided in the dielectric layer 17a at the positions on which the grounding terminals 13b are provided. The via 19 is formed by making a hole from the upper surface to the lower surface of the dielectric layer 17a and inserting an electrically-conductive material such as a metal in this hole.

The semiconductor device 1 is grounded by electrical connection between the grounding terminals 13b and the grounding layer 17b through the vias 19. The dielectric layer 17a has a predetermined dielectric constant. The dielectric layer 17a, the transmission line 14, and the grounding layer 17b form a micro-strip line. The dielectric layer 17c has a function to support the dielectric layer 17a and the grounding layer 17b.

The transmission line 14 is connected to the signal transmission terminal 13a, and the transmission line 14 transmits a millimeter-wave electrical signal in a predetermined direction (in FIGS. 2 and 3, in the right direction). The resonant pattern 15 having a symmetric shape with respect to the direction of the transmission line is formed in the transmission line 14. The shape of the resonant pattern 15 is e.g. a circular shape symmetric with respect to the predetermined direction. By this resonant pattern 15, impedance matching of the transmission line 14 is achieved, which makes it possible to reduce reflection of the millimeter-wave electrical signal.

An antenna part 16 is connected to the other end of the transmission line 14, and the antenna part 16 converts the millimeter-wave electrical signal to an electromagnetic wave signal. The antenna part 16 outputs the electromagnetic wave signal arising from the conversion by the antenna part 16 to the external via a sealing resin 18. The semiconductor device 1 is sealed by the sealing resin 18 in such a way that an upper part of the substrate 17 is covered. The sealing resin 18 is composed of an electrically-insulating material having a predetermined dielectric constant.

[Characteristic Example of Semiconductor Device 1 by Simulation]

Figure 4:
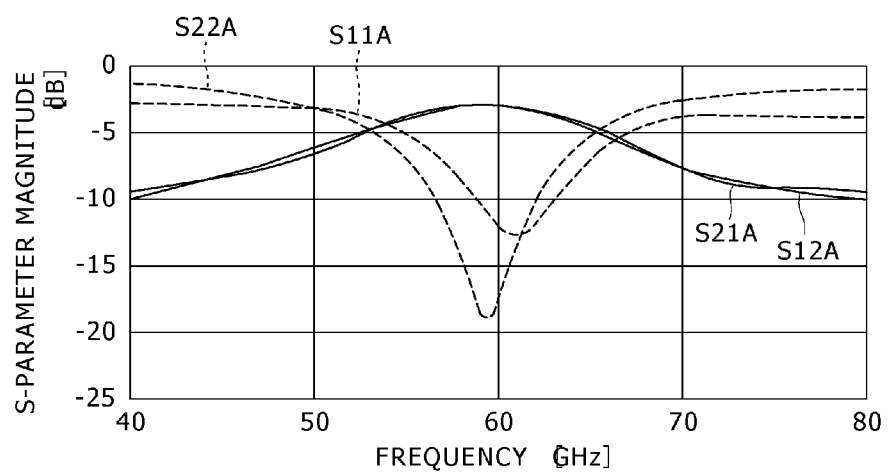
FIG. 4 is a graph showing a characteristic example of the semiconductor device, obtained by simulation.

A simulation result relating to the millimeter-wave signal transmission by the semiconductor device 1 will be described below. As shown in FIG. 4, this simulation result is represented by plotting the frequency (GHz) of the millimeter-wave electrical signal on the abscissa and plotting the S-parameter magnitude (dB) on the ordinate, and is obtained by calculation with use of the semiconductor device 1 shown in FIGS. 1 to 3 based on parameters shown in Table 2. The full lines in FIG. 4 indicate transfer characteristics S12A and S21A, and the dashed lines indicate reflection characteristics S11A and S22A.

TABLE 2

| | |
|---|---|
| Thickness A1 of transmission line 14 | 18 μm |
| Width A2 of transmission line 14 | 130 μm |
| Length A3 of transmission line 14 | 2 mm |
| Thickness A5 of dielectric layer 17a | 70 μm |
| Relative dielectric constant of dielectric layer 17a | 4.7 |
| Dissipation factor of dielectric layer 17a | 0.02 |
| Relative dielectric constant of sealing resin 18 | 4.2 |
| Dissipation factor of sealing resin 18 | 0.02 |
| Length of wire 12a | 635 μm |
| Length of wire 12b | 711 μm |
| Distance B4 between one end of transmission line 14 and center of resonant pattern 15 | 860 μm |
| Radius B6 of resonant pattern 15 | 350 μm |

As shown in Table 2, in this simulation, the width A2 of the transmission line 14 and the length A3 from one end of the transmission line 14 to the other end of the transmission line 14, shown in FIG. 2, are set to 130 μm and 2 mm, respectively. Referring to FIG. 3, the thickness A1 of the transmission line 14 is set to 18 μm, and the thickness A5 of the dielectric layer 17a in the substrate 17 is set to 70 μm. Furthermore, referring to FIG. 2, the distance B4 between one end of the transmission line 14 and the center of the resonant pattern 15 is set to 860 μm, and the radius B6 of the resonant pattern 15 is set to 350 μm. In addition, the relative dielectric constant and the dissipation factor of the dielectric layer 17a are set to 4.7 and 0.02, respectively. The relative dielectric constant and the dissipation factor of the sealing resin 18 are set to 4.2 and 0.02, respectively. The lengths of the wire 12a and the wire 12b are set to 635 μm and 711 μm, respectively.

As shown in FIG. 4, the transfer characteristics S12A and S21A have S-parameter magnitudes of about −3 dB when the frequency of the millimeter-wave electrical signal is around 60 GHz. The reflection characteristics S11A and S22A have S-parameter magnitudes of about −12 dB and −18 dB, respectively, when the frequency of the millimeter-wave electrical signal is around 60 GHz.

Figure 26:
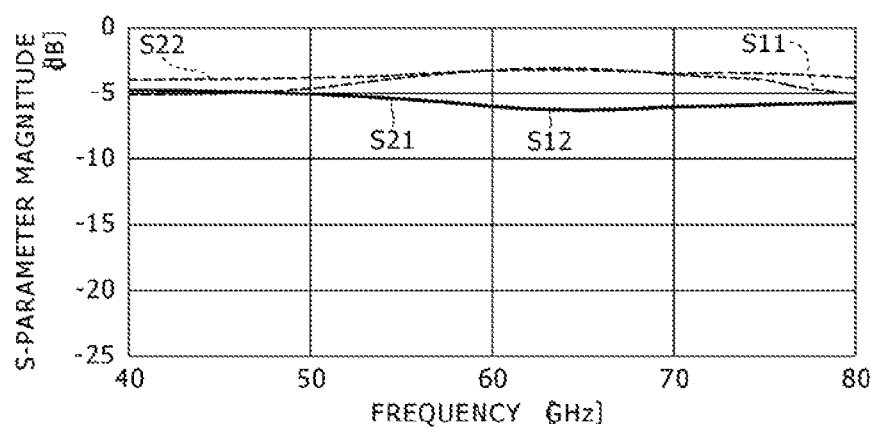
FIG. 26 is a graph showing a characteristic example of the semiconductor device, obtained by simulation.

As above, compared with the simulation result of the semiconductor device 100 of the related art, shown in FIG. 26, the S-parameter magnitudes of the transfer characteristics S12A and S21A are increased and the S-parameter magnitudes of the reflection characteristics S11A and S22A are decreased when the frequency of the millimeter-wave electrical signal is around 60 GHz. This indicates that the transmission characteristic of the millimeter-wave electrical signal can be enhanced. Based on this feature, the semiconductor device 1 can carry out high-speed data transmission involving little signal deterioration.

Figure 5:
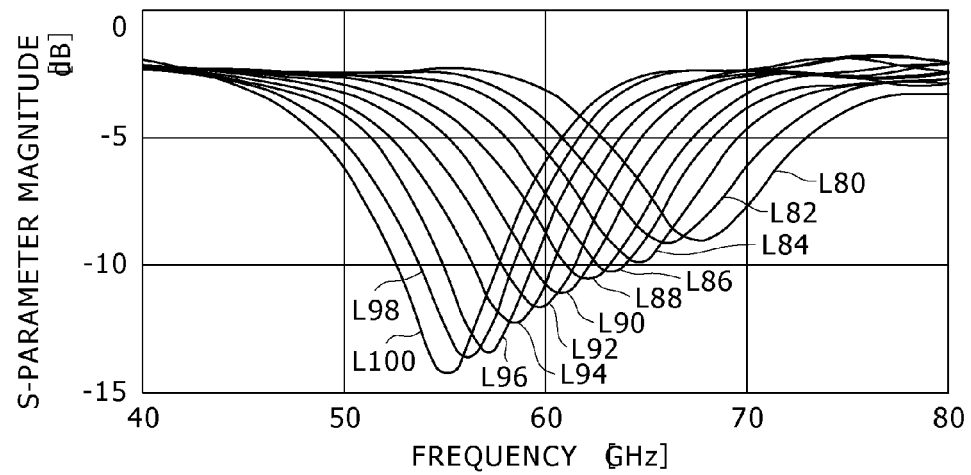
FIG. 5 is a graph showing a characteristic example of the semiconductor device including characteristic difference dependent on distance, obtained by simulation.

FIG. 5 shows a simulation result indicating the reflection characteristics of the semiconductor device 1, obtained by calculation with variation in the distance between one end of the transmission line 14 and the center of the resonant pattern 15 in the semiconductor device 1 (hereinafter, this distance will be referred to as the distance B4) in the range from 800 μm to 1000 μm in increments of 20 μm. As shown in FIG. 5, this simulation result is represented by plotting the frequency (GHz) of the millimeter-wave electrical signal on the abscissa and plotting the S-parameter magnitude (dB) on the ordinate, and is obtained by calculation with use of the parameters other than the distance B4, among the above-described parameters in Table 2.

In FIG. 5, a reflection characteristic L80 indicates the reflection characteristic of the semiconductor device 1 when the distance B4 is set to 800 μm. A reflection characteristic L82 indicates the reflection characteristic of the semiconductor device 1 when the distance B4 is set to 820 μm. A reflection characteristic L84 indicates the reflection characteristic of the semiconductor device 1 when the distance B4 is set to 840 μm. A reflection characteristic L86 indicates the reflection characteristic of the semiconductor device 1 when the distance B4 is set to 860 μm. A reflection characteristic L88 indicates the reflection characteristic of the semiconductor device 1 when the distance B4 is set to 880 μm. A reflection characteristic L90 indicates the reflection characteristic of the semiconductor device 1 when the distance B4 is set to 900 μm. A reflection characteristic L92 indicates the reflection characteristic of the semiconductor device 1 when the distance B4 is set to 920 μm. A reflection characteristic L94 indicates the reflection characteristic of the semiconductor device 1 when the distance B4 is set to 940 μm. A reflection characteristic L96 indicates the reflection characteristic of the semiconductor device 1 when the distance B4 is set to 960 μm. A reflection characteristic L98 indicates the reflection characteristic of the semiconductor device 1 when the distance B4 is set to 980 μm. A reflection characteristic L100 indicates the reflection characteristic of the semiconductor device 1 when the distance B4 is set to 1000 μm.

As shown in FIG. 5, the resonant frequency of the resonant pattern 15 is shifted depending on the distance B4. The resonant frequency of the resonant pattern 15 is about 68 GHz when the distance B4 is set to 800 μm. The resonant frequency of the resonant pattern 15 is about 66 GHz when the distance B4 is set to 820 μm. The resonant frequency of the resonant pattern 15 is about 65 GHz when the distance B4 is set to 840 μm. The resonant frequency of the resonant pattern 15 is about 63 GHz when the distance B4 is set to 860 μm. The resonant frequency of the resonant pattern 15 is about 62 GHz when the distance B4 is set to 880 μm. The resonant frequency of the resonant pattern 15 is about 61 GHz when the distance B4 is set to 900 μm. The resonant frequency of the resonant pattern 15 is about 60 GHz when the distance B4 is set to 920 μm. The resonant frequency of the resonant pattern 15 is about 58 GHz when the distance B4 is set to 940 μm. The resonant frequency of the resonant pattern 15 is about 57 GHz when the distance B4 is set to 960 μm. The resonant frequency of the resonant pattern 15 is about 56 GHz when the distance B4 is set to 980 μm. The resonant frequency of the resonant pattern 15 is about 55 GHz when the distance B4 is set to 1000 μm.

In this manner, the resonant frequency of the resonant pattern 15 is shifted toward the lower frequency side when the distance B4 is set longer. This feature makes it possible to transmit the millimeter-wave electrical signal at the desired frequency through change in the distance B4.

Figure 6:
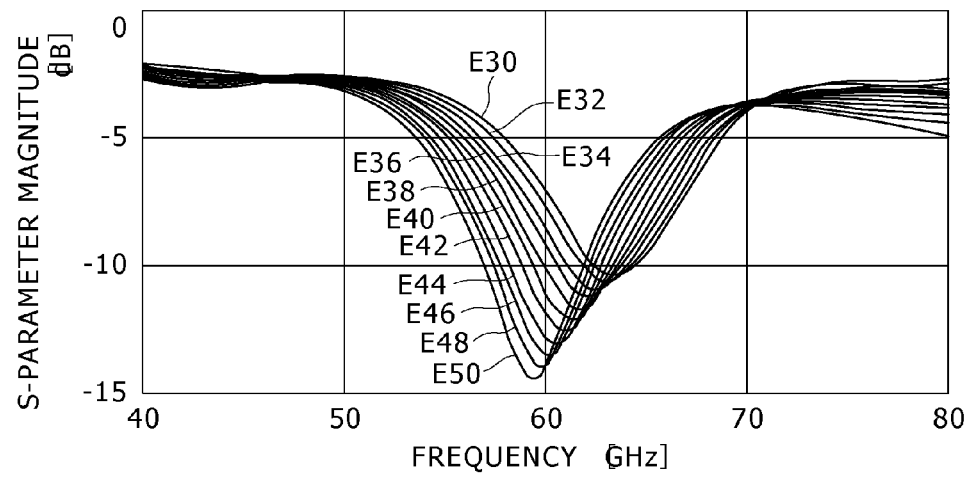
FIG. 6 is a graph showing a characteristic example of the semiconductor device including characteristic difference dependent on the relative dielectric constant of a sealing resin, obtained by simulation.

FIG. 6 shows a simulation result indicating the reflection characteristics, obtained by calculation with variation in the relative dielectric constant of the sealing resin 18 in the semiconductor device 1 in the range from 3.0 to 5.0 in increments of 0.2. As shown in FIG. 6, this simulation result is represented by plotting the frequency (GHz) of the millimeter-wave electrical signal on the abscissa and plotting the S-parameter magnitude (dB) on the ordinate, and is obtained by calculation with use of the parameters other than the relative dielectric constant of the sealing resin 18, among the above-described parameters in Table 2.

In FIG. 6, a reflection characteristic E30 indicates the reflection characteristic of the semiconductor device 1 when the relative dielectric constant of the sealing resin 18 is set to 3.0. A reflection characteristic E32 indicates the reflection characteristic of the semiconductor device 1 when the relative dielectric constant of the sealing resin 18 is set to 3.2. A reflection characteristic E34 indicates the reflection characteristic of the semiconductor device 1 when the relative dielectric constant of the sealing resin 18 is set to 3.4. A reflection characteristic E36 indicates the reflection characteristic of the semiconductor device 1 when the relative dielectric constant of the sealing resin 18 is set to 3.6. A reflection characteristic E38 indicates the reflection characteristic of the semiconductor device 1 when the relative dielectric constant of the sealing resin 18 is set to 3.8. A reflection characteristic E40 indicates the reflection characteristic of the semiconductor device 1 when the relative dielectric constant of the sealing resin 18 is set to 4.0. A reflection characteristic E42 indicates the reflection characteristic of the semiconductor device 1 when the relative dielectric constant of the sealing resin 18 is set to 4.2. A reflection characteristic E44 indicates the reflection characteristic of the semiconductor device 1 when the relative dielectric constant of the sealing resin 18 is set to 4.4. A reflection characteristic E46 indicates the reflection characteristic of the semiconductor device 1 when the relative dielectric constant of the sealing resin 18 is set to 4.6. A reflection characteristic E48 indicates the reflection characteristic of the semiconductor device 1 when the relative dielectric constant of the sealing resin 18 is set to 4.8. A reflection characteristic E50 indicates the reflection characteristic of the semiconductor device 1 when the relative dielectric constant of the sealing resin 18 is set to 5.0.

As shown in FIG. 6, the resonant frequency of the resonant pattern 15 is shifted depending on the relative dielectric constant of the sealing resin 18. The resonant frequency of the resonant pattern 15 is about 64 GHz when the relative dielectric constant of the sealing resin 18 is set to 3.0. The resonant frequency of the resonant pattern 15 is about 63.5 GHz when the relative dielectric constant of the sealing resin 18 is set to 3.2. The resonant frequency of the resonant pattern 15 is about 63 GHz when the relative dielectric constant of the sealing resin 18 is set to 3.4. The resonant frequency of the resonant pattern 15 is about 62.5 GHz when the relative dielectric constant of the sealing resin 18 is set to 3.6. The resonant frequency of the resonant pattern 15 is about 62 GHz when the relative dielectric constant of the sealing resin 18 is set to 3.8. The resonant frequency of the resonant pattern 15 is about 61.5 GHz when the relative dielectric constant of the sealing resin 18 is set to 4.0. The resonant frequency of the resonant pattern 15 is about 61 GHz when the relative dielectric constant of the sealing resin 18 is set to 4.2. The resonant frequency of the resonant pattern 15 is about 60.5 GHz when the relative dielectric constant of the sealing resin 18 is set to 4.4. The resonant frequency of the resonant pattern 15 is about 60 GHz when the relative dielectric constant of the sealing resin 18 is set to 4.6. The resonant frequency of the resonant pattern 15 is about 59.5 GHz when the relative dielectric constant of the sealing resin 18 is set to 4.8. The resonant frequency of the resonant pattern 15 is about 59 GHz when the relative dielectric constant of the sealing resin 18 is set to 5.0.

In this manner, the resonant frequency of the resonant pattern 15 is shifted toward the lower frequency side when the relative dielectric constant of the sealing resin 18 is set higher. This feature makes it possible to transmit the millimeter-wave electrical signal at the desired frequency through change in the relative dielectric constant of the sealing resin 18.

[Manufacturing Example of Semiconductor Device 1]

Figure 7:
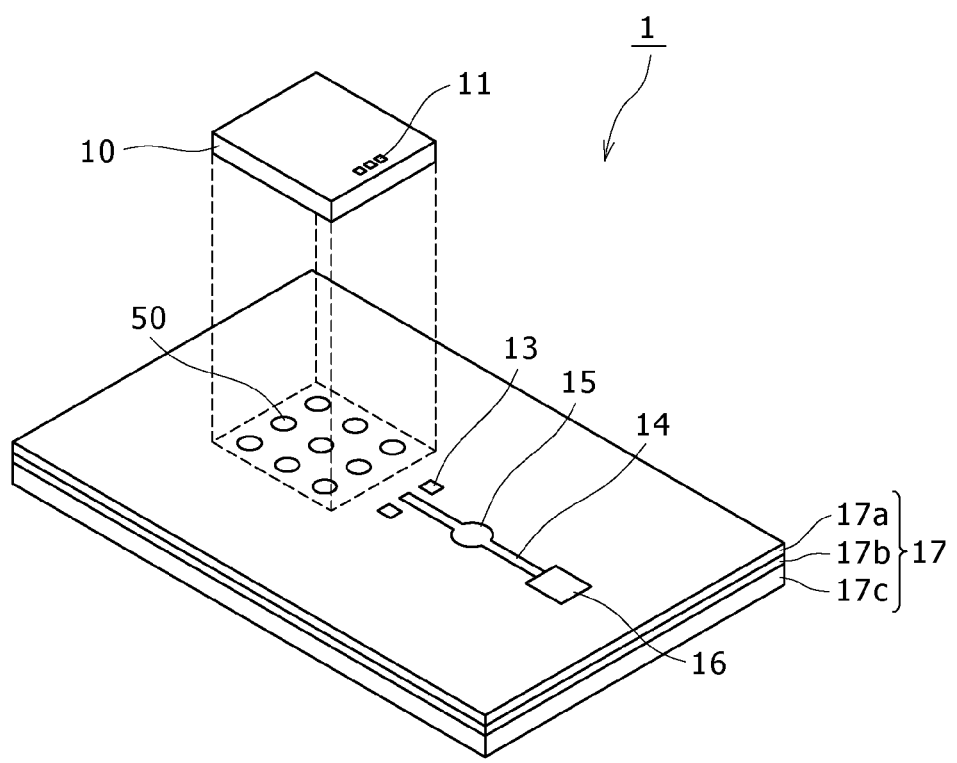
FIG. 7 is an exploded perspective view showing a manufacturing example of the semiconductor device.

A method for manufacturing the semiconductor device 1 will be described below. As shown in FIG. 7, for the semiconductor device 1, the terminal unit 13, the transmission line 14, the resonant pattern 15, and the antenna part 16 are formed on a predetermined surface (in FIG. 7, the upper surface) of the substrate 17 composed of the dielectric layers 17*a* and 17*c* and the grounding layer 17*b*. The terminal unit 13, the transmission line 14, the resonant pattern 15, and the antenna part 16 are formed by e.g. etching.

The dielectric layers 17*a* and 17*c* are composed of an electrically-insulating material and formed by using e.g. resin or ceramics. The grounding layer 17*b*, the terminal unit 13, the transmission line 14, the resonant pattern 15, and the antenna part 16 are composed of the same electrically-conductive material and formed by using e.g. copper or aluminum.

A patch antenna is employed as an example of the antenna part 16 in this manufacturing example. The patch antenna can be fabricated as a thin component similarly to the terminal unit 13, the transmission line 14, and the resonant pattern 15. Thus, the adhesion between the antenna part 16 and the sealing resin 18 can be increased, so that efficient electromagnetic coupling is achieved. Furthermore, the patch antenna can be fabricated at low cost because it has a simple two-dimensional physical shape.

Paste 50 is applied at a predetermined position (in FIG. 7, in the dashed line rectangle) on the substrate 17 on which the terminal unit 13, the transmission line 14, the resonant pattern 15, and the antenna part 16 are formed. The paste 50 is composed of e.g. a metal material such as silver or aluminum and an organic solvent. The circuit board 10 on which the terminal unit 11 is formed is placed on the substrate 17 on which the paste 50 is applied. The substrate 17 on which the circuit board 10 is placed is loaded in a constant-temperature chamber or a conveyer drying oven at about 200° C., and the paste 50 is dried. This surely fixes the substrate 17 and the circuit board 10 to each other.

Figure 8:
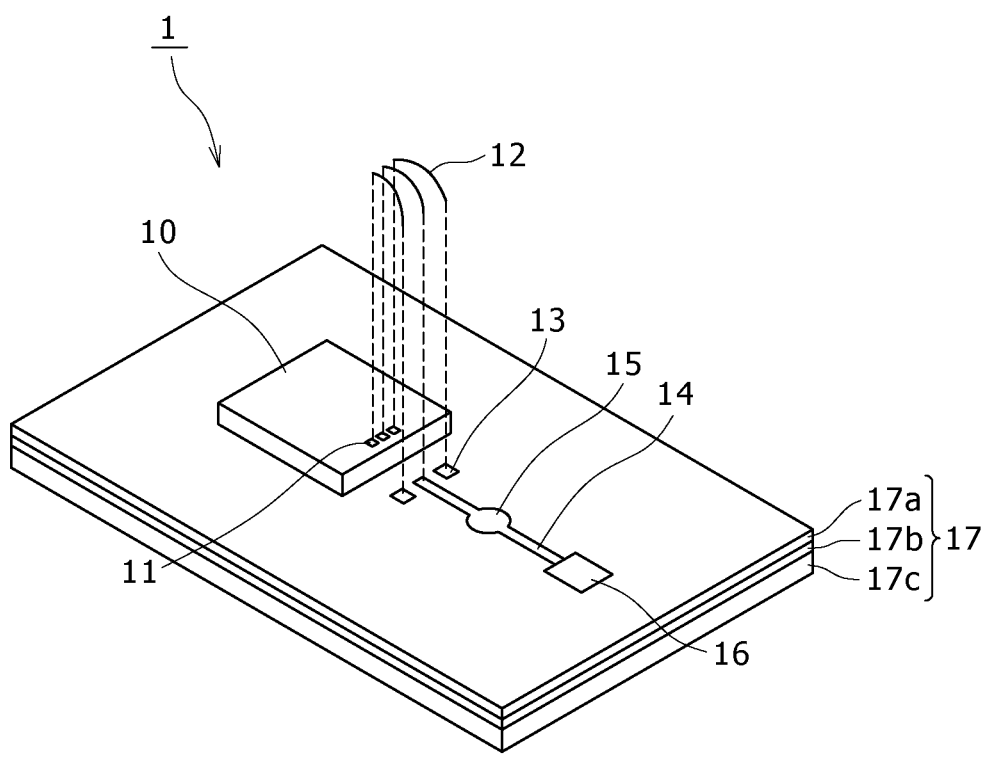
FIG. 8 is an exploded perspective view showing the manufacturing example of the semiconductor device.

After the paste 50 is dried, as shown in FIG. 8, the terminal unit 11 on the circuit board 10 is connected to the terminal unit 13 on the substrate 17 by the wire unit 12. For this connection between the terminal units 11 and 13 by the wire unit 12, e.g. apparatus for wire bonding, called a wire bonder, is used.

Figure 9:
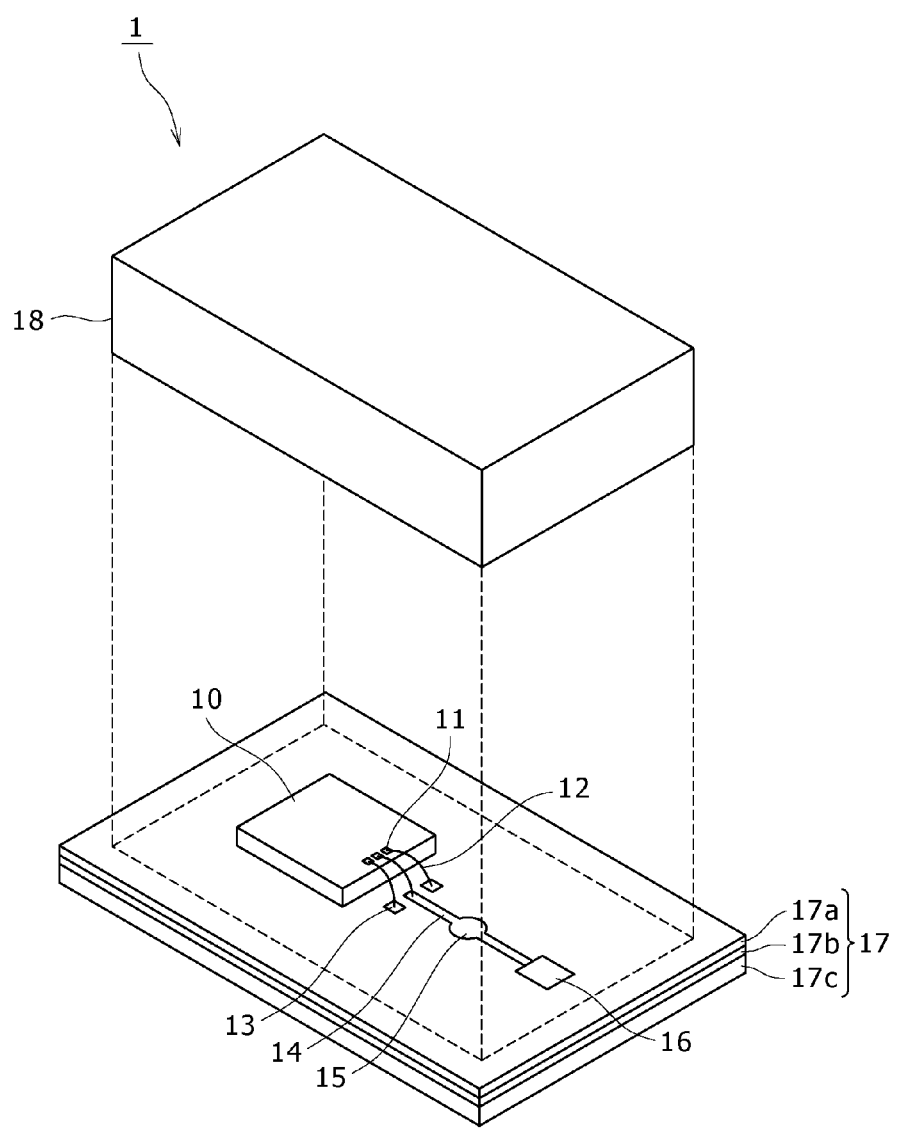
FIG. 9 is an exploded perspective view showing the manufacturing example of the semiconductor device.

As shown in FIG. 9, the upper surface of the substrate 17 on which the wire unit 12 is mounted is sealed by injection molding of the sealing resin 18. The sealing resin 18 has the electrically-insulating characteristic and a predetermined dielectric constant, and transmits a signal output from the antenna part 16. Furthermore, the sealing resin 18 has a function for protection from dusts and water from the external. For the sealing resin 18, e.g. a resin material such as an epoxy resin or a urethane resin is used.

By such a manufacturing method, the semiconductor device 1, which is allowed to have an enhanced transmission characteristic of the millimeter-wave electrical signal through impedance matching of the transmission line 14 by the resonant pattern 15, can be fabricated at low cost.

As above, in the semiconductor device 1 according to the first embodiment, the circuit board 10 processes an electrical signal having a millimeter-wave frequency. The transmission line 14 is connected to the circuit board 10 via the wire unit 12 and transmits the electrical signal. On the premise of this configuration, the resonant pattern 15 having a symmetric shape with respect to the direction of the transmission line 14 is provided in the transmission line 14. Thus, impedance matching of the transmission line 14 is achieved by the resonant pattern 15, which makes it possible to reduce reflection of the electrical signal that is transmitted through this transmission line 14 and has the millimeter-wave frequency. As a result, the transmission characteristic of the millimeter-wave electrical signal can be enhanced, and the semiconductor device 1 capable of high-speed data transmission involving little signal deterioration can be provided.

Second Embodiment

[Configuration Example of Semiconductor Device 2]

The present embodiment relates to a semiconductor device in which a resonant pattern is provided in a transmission line on a circuit board. In this second embodiment, the component having the same name and symbol as those of the component in the above-described first embodiment has the same function, and therefore description thereof is omitted.

Figure 10:
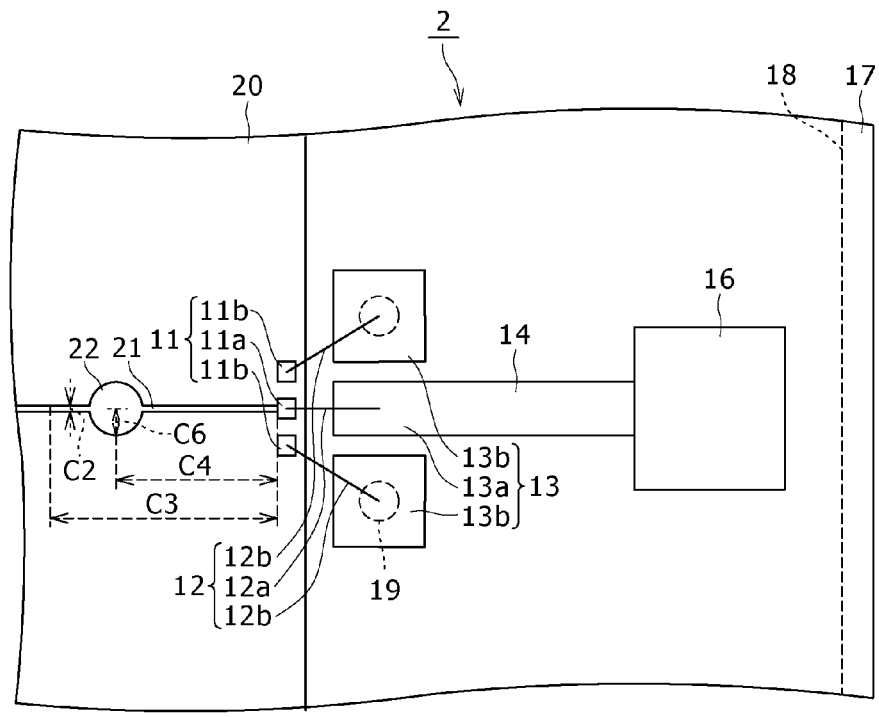
FIG. 10 is a plan view showing a configuration example of a major part of a semiconductor device according to a second embodiment of the present invention.
Figure 11:
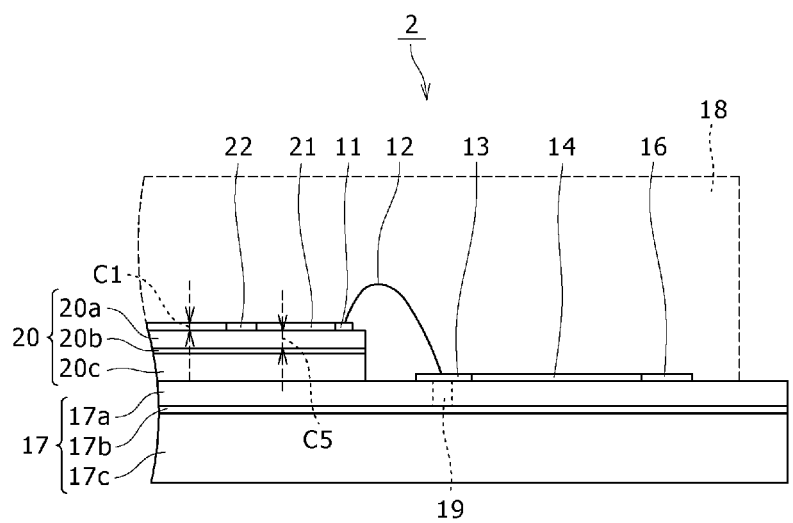
FIG. 11 is a side view showing the configuration example of the major part of the semiconductor device.

As shown in FIGS. 10 and 11, a semiconductor device 2 according to the present embodiment includes a circuit board 20 serving as a semiconductor circuit element that processes a millimeter-wave electrical signal, and a second transmission line (hereinafter, referred to as the transmission line 21) that is provided on the circuit board 20 and transmits the electrical signal. In the transmission line 21, a resonant pattern 22 serving as an impedance matching pattern having a symmetric shape with respect to the transmission line 21 is provided. Furthermore, the semiconductor device 2 includes a substrate 17 and a sealing resin 18.

The circuit board 20 is composed of a first dielectric layer (hereinafter, referred to as the dielectric layer 20a), a grounding layer 20b, and a second dielectric layer (hereinafter, referred to as the dielectric layer 20c). The grounding layer 20b is formed of copper or aluminum and has a function for grounding. The dielectric layer 20a has a predetermined dielectric constant. The dielectric layer 20a, the transmission line 21, and the grounding layer 20b form a micro-strip line. The dielectric layer 20c has a function to support the dielectric layer 20a and the grounding layer 20b.

On the surface of the circuit board 20, a terminal unit 11 composed of a signal transmission terminal 11a and grounding terminals 11b, the transmission line 21, and the resonant pattern 22 are formed. The terminal unit 11, the transmission line 21, and the resonant pattern 22 are formed by covering the surface of the circuit board 20 with a mask or the like having a predetermined pattern and depositing a metal material such as copper or aluminum.

The resonant pattern 22 has a symmetric shape with respect to the direction in which the transmission line 21 transmits the millimeter-wave electrical signal. The shape of the resonant pattern 22 is e.g. a circular shape symmetric with respect to a predetermined direction. By this resonant pattern 22, impedance matching of the transmission line 21 is achieved, which makes it possible to reduce reflection of the millimeter-wave electrical signal. This feature can enhance the transmission characteristic of the millimeter-wave electrical signal.

The substrate 17 has a terminal unit 13 composed of a signal transmission terminal 13a and grounding terminals 13b. The grounding terminals 11b are connected to the grounding terminals 13b via wires 12b included in a wire unit 12.

The substrate 17 has a dielectric layer 17a, a grounding layer 17b, and a dielectric layer 17c. Vias 19 having electrical conductivity are provided in the dielectric layer 17a at the positions on which the grounding terminals 13b are provided. The via 19 is formed by making a hole from the upper surface to the lower surface of the dielectric layer 17a and inserting an electrically-conductive material such as a metal in this hole.

The semiconductor device 2 is grounded by electrical connection between the grounding terminals 13b and the grounding layer 17b through the vias 19. The dielectric layer 17a has a predetermined dielectric constant. The dielectric layer 17a, the transmission line 14, and the grounding layer 17b form a micro-strip line. The dielectric layer 17c has a function to support the dielectric layer 17a and the grounding layer 17b.

The signal transmission terminal 11a is connected to the signal transmission terminal 13a on the substrate 17 via a wire 12a included in the wire unit 12. The transmission line 14 is connected to the signal transmission terminal 13a, and the transmission line 14 transmits the millimeter-wave electrical signal in a predetermined direction (in FIGS. 10 and 11, in the right direction).

An antenna part 16 is connected to the other end of the transmission line 14, and the antenna part 16 converts the millimeter-wave electrical signal to an electromagnetic wave signal. The antenna part 16 outputs the electromagnetic wave signal arising from the conversion by the antenna part 16 to the external via the sealing resin 18. The semiconductor device 2 is sealed by the sealing resin 18 in such a way that an upper part of the substrate 17 is covered. The sealing resin 18 is composed of an electrically-insulating material having a predetermined dielectric constant.

The operation of the semiconductor device 2 having the above-described configuration will be described below. The millimeter-wave electrical signal processed by the circuit board 20 is transmitted through the transmission line 21 provided with the resonant pattern 22. This millimeter-wave electrical signal can be transmitted through the transmission line 21 without suffering from the influence of reflection because impedance matching of the transmission line 21 is achieved by the resonant pattern 22. The millimeter-wave electrical signal transmitted through the transmission line 21 is subsequently transmitted through the transmission line 14 via the signal transmission terminal 11a provided on the circuit board 20, the wire 12a, and the signal transmission terminal 13a. The millimeter-wave electrical signal transmitted through the transmission line 14 is converted to the electromagnetic wave signal by the antenna part 16, and the electromagnetic wave signal is output to the outside of the semiconductor device 2.

[Characteristic Example of Semiconductor Device 2 by Simulation]

Figure 12:
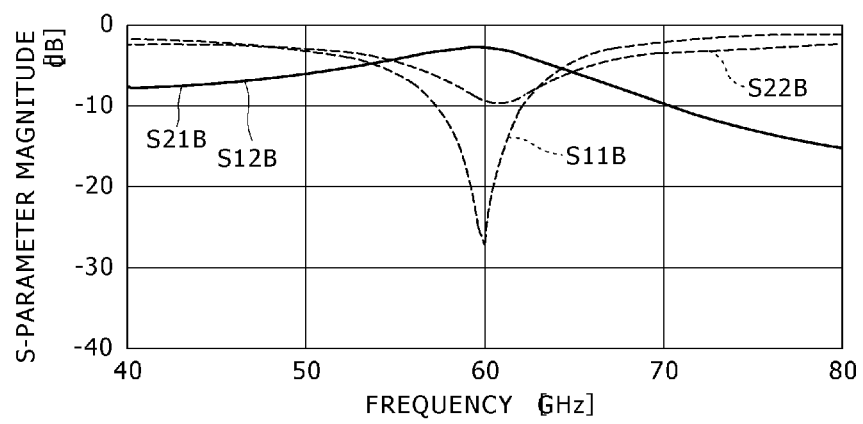
FIG. 12 is a graph showing a characteristic example of the semiconductor device, obtained by simulation.

A simulation result relating to the millimeter-wave signal transmission by the semiconductor device 2 will be described below. As shown in FIG. 12, this simulation result is represented by plotting the frequency (GHz) of the millimeter-wave electrical signal on the abscissa and plotting the S-parameter magnitude (dB) on the ordinate, and is obtained by calculation with use of the semiconductor device 2 shown in FIGS. 10 and 11 based on parameters shown in Table 3. The full lines in FIG. 12 indicate transfer characteristics S12B and S21B, and the dashed lines indicate reflection characteristics S11B and S22B.

TABLE 3

| | |
|---|---|
| Thickness C1 of transmission line 21 | 1 μm |
| Width C2 of transmission line 21 | 10 μm |
| Length C3 of transmission line 21 | 2 mm |
| Thickness C5 of dielectric layer 20a | 5 μm |
| Relative dielectric constant of dielectric layer 20a | 3.5 |
| Dissipation factor of dielectric layer 20a | 0.01 |
| Relative dielectric constant of sealing resin 18 | 4.2 |
| Dissipation factor of sealing resin 18 | 0.02 |
| Length of wire 12a | 635 μm |
| Length of wire 12b | 711 μm |
| Distance C4 between one end of transmission line 21 and center of resonant pattern 22 | 530 μm |
| Radius C6 of resonant pattern 22 | 60 μm |

As shown in Table 3, in this simulation, the width C2 of the transmission line 21 and the length C3 from one end of the transmission line 21 to the other end of the transmission line 21, shown in FIG. 10, are set to 10 μm and 2 mm, respectively. Referring to FIG. 11, the thickness C1 of the transmission line 21 is set to 1 μm, and the thickness C5 of the dielectric layer 20a is set to 5 μm. Furthermore, referring to FIG. 10, the distance C4 between one end of the transmission line 21 and the center of the resonant pattern 22 is set to 530 μm, and the radius C6 of the resonant pattern 22 is set to 60 μm. In addition, the relative dielectric constant and the dissipation factor of the dielectric layer 20a are set to 3.5 and 0.01, respectively. The relative dielectric constant and the dissipation factor of the sealing resin 18 are set to 4.2 and 0.02, respectively. The lengths of the wire 12a and the wire 12b are set to 635 μm and 711 μm, respectively.

As shown in FIG. 12, the transfer characteristics S12B and S21B have S-parameter magnitudes of about −3 dB when the frequency of the millimeter-wave electrical signal is around 60 GHz. The reflection characteristics S11B and S22B have S-parameter magnitudes of about −26 dB and −10 dB, respectively, when the frequency of the millimeter-wave electrical signal is around 60 GHz.

As above, compared with the simulation result of the semiconductor device 100 of the related art, shown in FIG. 26, the S-parameter magnitudes of the transfer characteristics S12B and S21B are increased and the S-parameter magnitudes of the reflection characteristics S11B and S22B are decreased when the frequency of the millimeter-wave electrical signal is around 60 GHz. This indicates that the transmission characteristic of the millimeter-wave electrical signal can be enhanced. Based on this feature, the semiconductor device 2 can carry out high-speed data transmission involving little signal deterioration.

As above, in the semiconductor device 2 according to the second embodiment, the circuit board 20 has the transmission line 21 for transmitting the millimeter-wave electrical signal in a predetermined direction, and the resonant pattern 22 having a symmetric shape with respect to the direction of the transmission line 21, e.g. a circular shape, is provided in this transmission line 21. Thus, impedance matching of the transmission line 21 is achieved by the resonant pattern 22, which makes it possible to reduce reflection of the millimeter-wave electrical signal transmitted through this transmission line 21. As a result, the transmission characteristic of the millimeter-wave electrical signal can be enhanced, and the semiconductor device 2 capable of high-speed data transmission involving little signal deterioration can be provided.

Third Embodiment

[Configuration Example of Semiconductor Device 3]

The present embodiment relates to a semiconductor device obtained by omitting the sealing resin 18 of the semiconductor device 1. In this third embodiment, the component having the same name and symbol as those of the component in the above-described first embodiment has the same function, and therefore description thereof is omitted.

Figure 13:
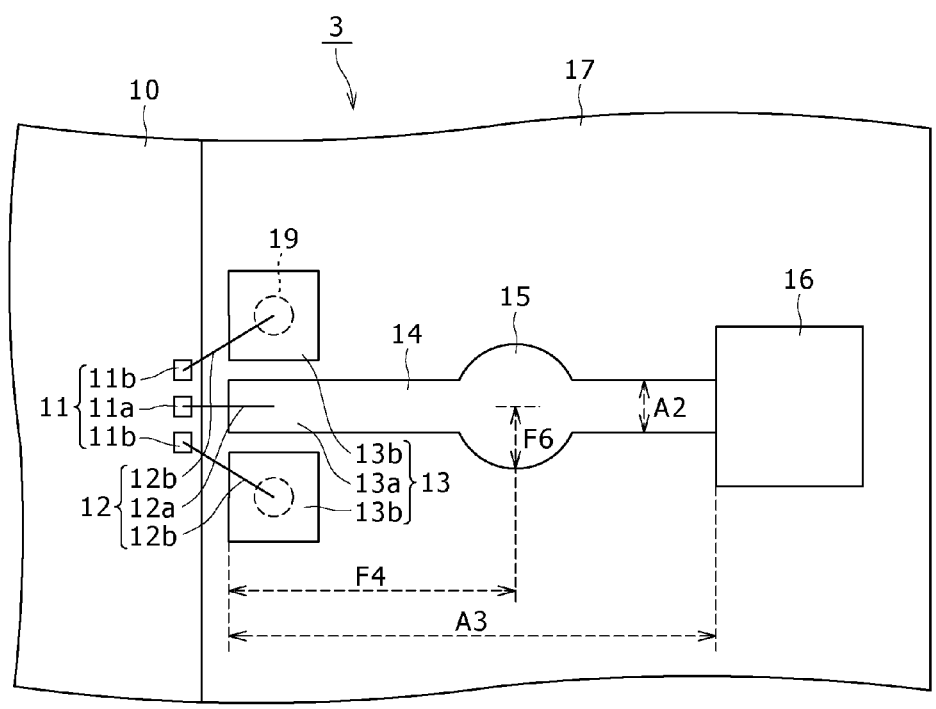
FIG. 13 is a plan view showing a configuration example of a major part of a semiconductor device according to a third embodiment of the present invention.
Figure 14:
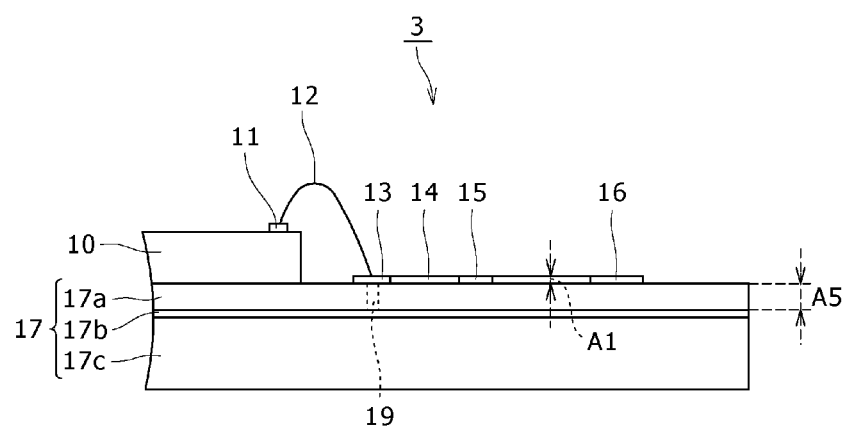
FIG. 14 is a front view showing the configuration example of the major part of the semiconductor device.

As shown in FIGS. 13 and 14, a semiconductor device 3 according to the present embodiment includes a circuit board 10 that processes a millimeter-wave electrical signal and a transmission line 14 that is connected to the circuit board 10 via a wire unit 12 and transmits the electrical signal. In the transmission line 14, a resonant pattern 15 having a symmetric shape with respect to the direction of this transmission line is provided. The semiconductor device 3 further includes a substrate 17 on which the transmission line 14 and the resonant pattern 15 are formed. The circuit board 10 and the surface of the substrate 17 are not sealed by a sealing resin.

[Characteristic Example of Semiconductor Device 3 by Simulation]

Figure 15:
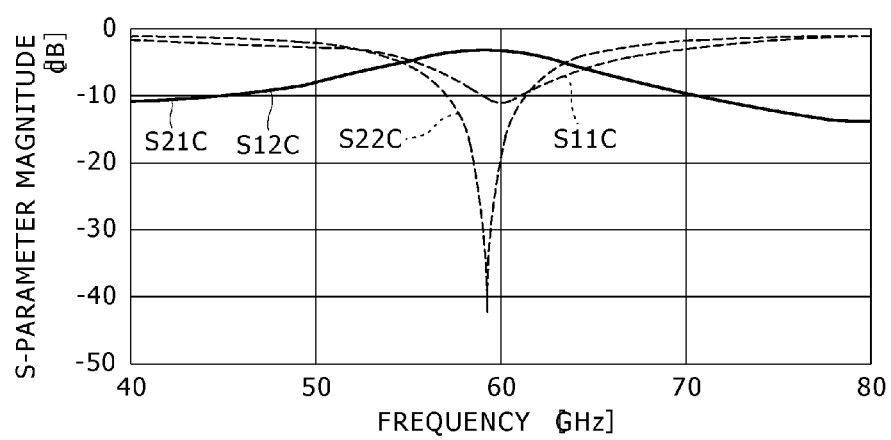
FIG. 15 is a graph showing a characteristic example of the semiconductor device, obtained by simulation.

A simulation result relating to the millimeter-wave signal transmission by the semiconductor device 3 will be described below. As shown in FIG. 15, this simulation result is represented by plotting the frequency (GHz) of the millimeter-wave electrical signal on the abscissa and plotting the S-parameter magnitude (dB) on the ordinate, and is obtained by calculation with use of the semiconductor device 3 shown in FIGS. 13 and 14 based on parameters shown in Table 4. The full lines in FIG. 15 indicate transfer characteristics S12C and S21C, and the dashed lines indicate reflection characteristics S11C and S22C.

TABLE 4

| | |
|---|---|
| Thickness A1 of transmission line 14 | 18 μm |
| Width A2 of transmission line 14 | 130 μm |
| Length A3 of transmission line 14 | 2 mm |
| Thickness A5 of dielectric layer 17a | 70 μm |
| Relative dielectric constant of dielectric layer 17a | 4.7 |
| Dissipation factor of dielectric layer 17a | 0.02 |
| Length of wire 12a | 635 μm |
| Length of wire 12b | 711 μm |
| Distance F4 between one end of transmission line 14 and center of resonant pattern 15 | 980 μm |
| Radius F6 of resonant pattern 15 | 350 μm |

As shown in Table 4, in this simulation, the width A2 of the transmission line 14 and the length A3 from one end of the transmission line 14 to the other end of the transmission line 14, shown in FIG. 13, are set to 130 μm and 2 mm, respectively. Referring to FIG. 14, the thickness A1 of the transmission line 14 is set to 18 μm, and the thickness A5 of the dielectric layer 17a is set to 70 μm. Furthermore, referring to FIG. 13, the distance F4 between one end of the transmission line 14 and the center of the resonant pattern 15 is set to 980 μm, and the radius F6 of the resonant pattern 15 is set to 350 μm. In addition, the relative dielectric constant and the dissipation factor of the dielectric layer 17a are set to 4.7 and 0.02, respectively. The lengths of the wire 12a and the wire 12b are set to 635 μm and 711 μm, respectively.

As shown in FIG. 15, the transfer characteristics S12C and S21C have S-parameter magnitudes of about −3 dB when the frequency of the millimeter-wave electrical signal is around 60 GHz. The reflection characteristics S11C and S22C have S-parameter magnitudes of about −11 dB and −42 dB, respectively, when the frequency of the millimeter-wave electrical signal is around 60 GHz.

As above, compared with the simulation result of the semiconductor device 100 of the related art, shown in FIG. 26, the S-parameter magnitudes of the transfer characteristics S12C and S21C are increased and the S-parameter magnitudes of the reflection characteristics S11C and S22C are decreased when the frequency of the millimeter-wave electrical signal is around 60 GHz. This indicates that the transmission characteristic of the millimeter-wave electrical signal can be enhanced. Based on this feature, the semiconductor device 3 can carry out high-speed data transmission involving little signal deterioration.

As above, in the semiconductor device 3 according to the third embodiment, impedance matching of the transmission line 14 is achieved by the resonant pattern 15 although a sealing resin is not provided. This makes it possible to reduce reflection of the millimeter-wave electrical signal transmitted through this transmission line 14.

Fourth Embodiment

[Configuration Example of Semiconductor Device 4]

The present embodiment relates to a semiconductor device 4 having a printed board 35 provided with an antenna part 29. In this fourth embodiment, the component having the same name and symbol as those of the component in the above-described first embodiment has the same function, and therefore description thereof is omitted.

Figure 16:
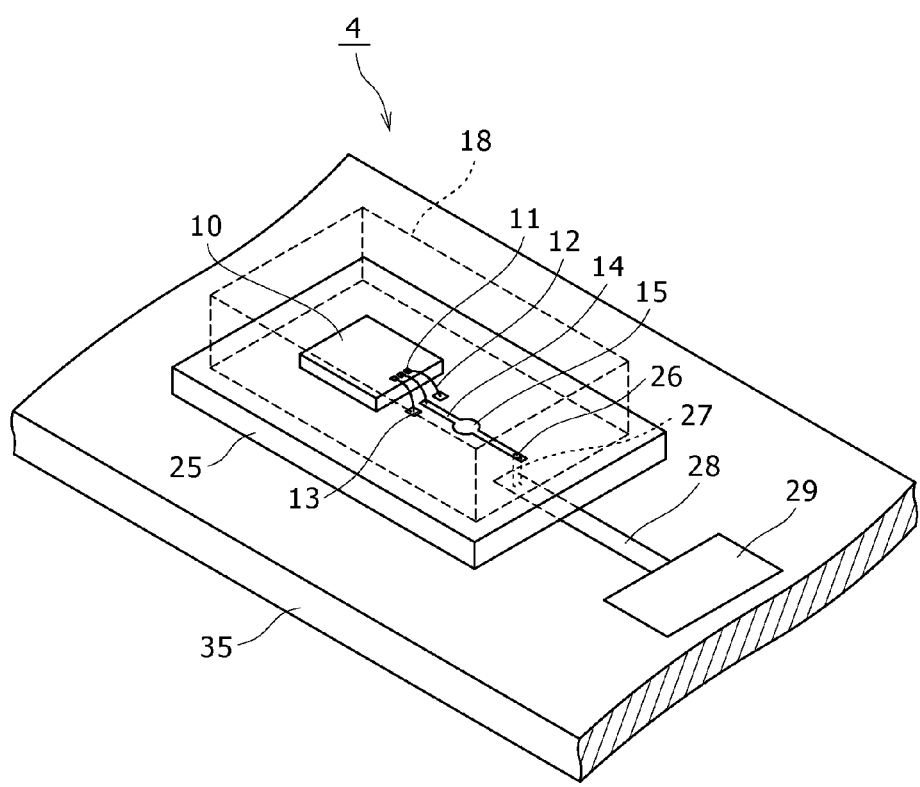
FIG. 16 is a perspective view showing a configuration example of a semiconductor device according to a fourth embodiment of the present invention.

As shown in FIG. 16, the semiconductor device 4 according to the present embodiment includes a circuit board 10 that processes a millimeter-wave electrical signal and a transmission line 14 that is connected to the circuit board 10 via a wire unit 12 and transmits the electrical signal. In the transmission line 14, a resonant pattern 15 having a symmetric shape with respect to the transmission line 14 is provided. The semiconductor device 4 further includes an interposer substrate (hereinafter, referred to as the substrate 25) on which the transmission line 14 is formed and the printed board 35 having a third transmission line (hereinafter, referred to as the transmission line 28) and the antenna part 29.

The substrate 25 is equivalent to a component obtained by omitting the antenna part 16 on the substrate 17 in the first embodiment and providing a second via (hereinafter, referred to as the via 27). On the surface of the printed board 35, the transmission line 28 and the antenna part 29 are formed. The transmission line 28 and the antenna part 29 are formed by using an electrically-conductive metal such as copper or aluminum.

In the semiconductor device 4, the substrate 25 is placed on a predetermined surface of the printed board 35. The printed board 35 and the substrate 25 are electrically connected to each other by the via 27 in the substrate 25. The via 27 is formed by making a hole from the upper surface to the lower surface of the substrate 25 and inserting an electrically-conductive material such as a metal in this hole.

A millimeter-wave electrical signal is processed by the circuit board 10, and the processed millimeter-wave electrical signal is output to a terminal unit 13 on the substrate 25 via a terminal unit 11 and the wire unit 12. The millimeter-wave electrical signal output to the terminal unit 13 is transmitted through the transmission line 14 in a predetermined direction. In the transmission line 14, the resonant pattern 15 symmetric with respect to the direction of the transmission line 14 is provided. Impedance matching of the transmission line 14 is achieved by this resonant pattern 15, and thus the transmission characteristic of the millimeter-wave electrical signal can be enhanced. The millimeter-wave electrical signal, whose transmission characteristic is enhanced, is output to the transmission line 28 on the printed board 35 through the via 27. The millimeter-wave electrical signal is transmitted through the transmission line 28 and output to the antenna part 29 at one end of the transmission line 28. The antenna part 29 converts the output millimeter-wave electrical signal to an electromagnetic wave signal and outputs the signal to the external.

As above, in the semiconductor device 4 according to the fourth embodiment, the millimeter-wave electrical signal is transmitted by the transmission line 28 formed on the printed board 35, and therefore the flexibility of the configuration of the antenna part 29 is high.

Fifth Embodiment

[Configuration Example of Transmission System 5]

The present embodiment relates to a transmission system 5 that employs two semiconductor devices 1 in the first embodiment and allows transmission of a millimeter-wave between the semiconductor devices. In this embodiment, the component having the same name and numeral/symbol as those of the component in the above-described first embodiment has the same function, and therefore description thereof is omitted.

Figure 17:
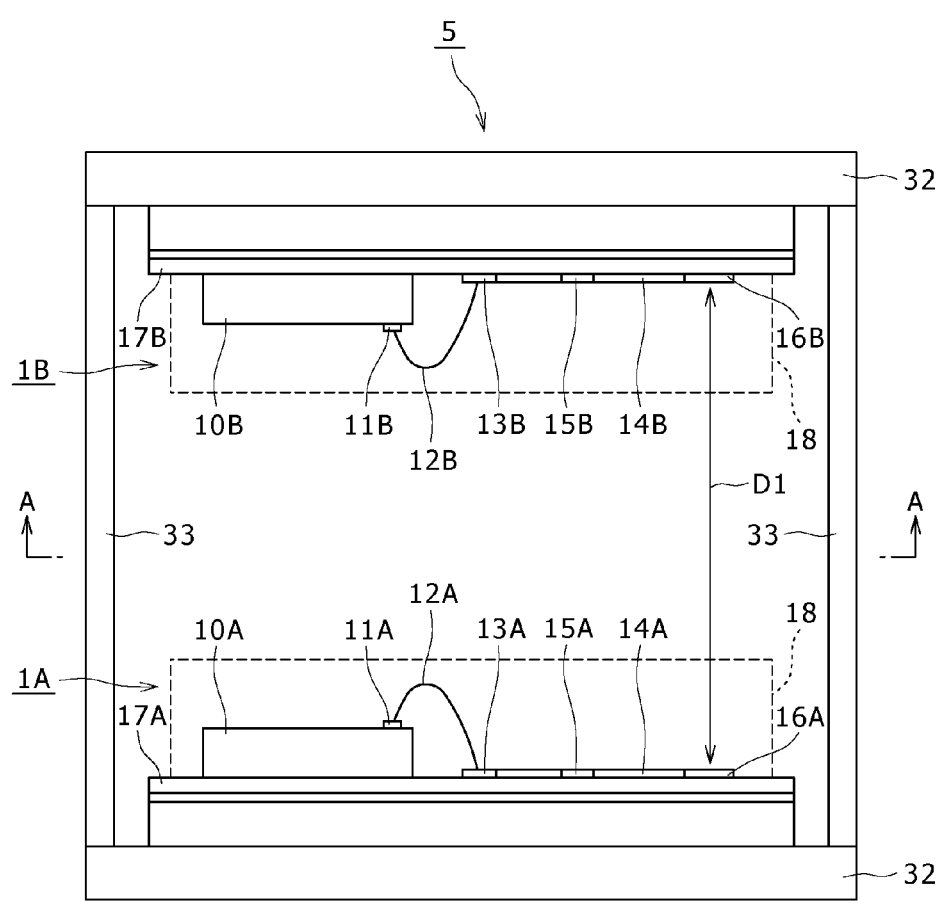
FIG. 17 is a side view showing a configuration example of a transmission system according to a fifth embodiment of the present invention.
Figure 18:
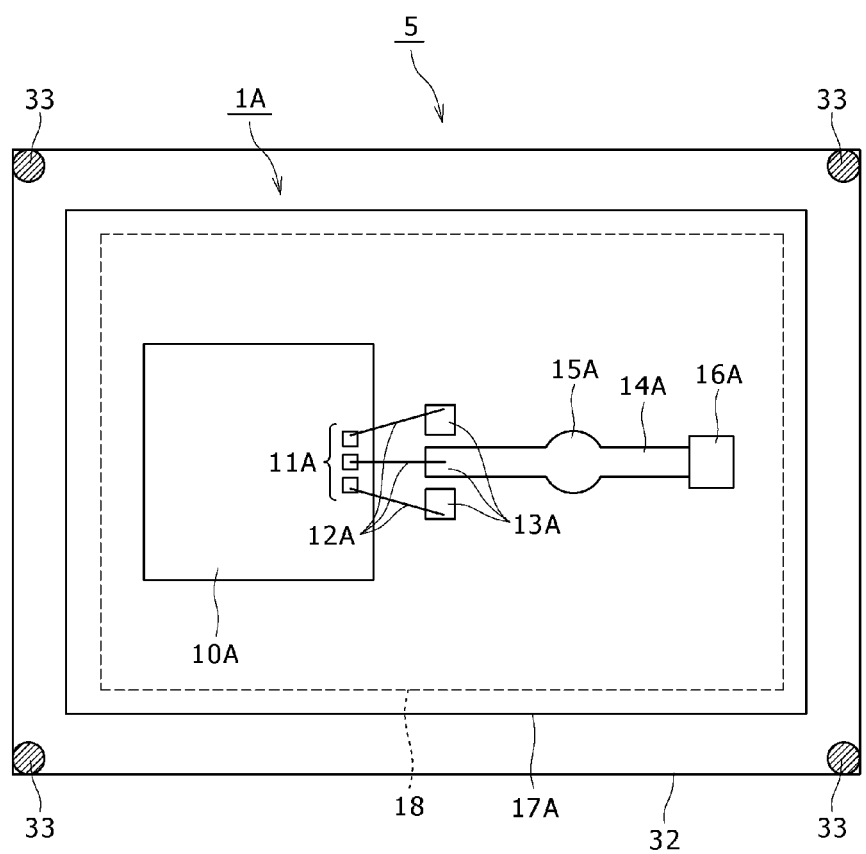
FIG. 18 is a plan view showing the configuration example of the transmission system, parallel to the section along line A-A in FIG. 17.

As shown in FIGS. 17 and 18, the transmission system 5 includes a first semiconductor device (hereinafter, referred to as the semiconductor device 1A) and a second semiconductor device (hereinafter, referred to as the semiconductor device 1B). Support substrates 32 are provided under the semiconductor device 1A and on the semiconductor device 1B. Support pillars 33 are provided at four corners of the support substrates 32. The semiconductor devices 1A and 1B are fixed to predetermined positions by the support substrates 32 and the support pillars 33.

The semiconductor device 1A includes a first circuit board (hereinafter, referred to as the circuit board 10A) and a first interposer substrate (hereinafter, referred to as the substrate 17A). The circuit board 10A processes a millimeter-wave electrical signal and outputs the processed millimeter-wave electrical signal from a terminal unit 11A to the substrate 17A. The substrate 17A has a first terminal unit (hereinafter, referred to as the terminal unit 13A), a first transmission line (hereinafter, referred to as the transmission line 14A), a first resonant pattern (hereinafter, referred to as the resonant pattern 15A), and a first antenna part (hereinafter, referred to as the antenna part 16A).

The transmission line 14A transmits the millimeter-wave electrical signal processed by the circuit board 10A in a predetermined direction (in FIG. 17, in the right direction). The terminal unit 13A at one end of this transmission line 14A is connected to the terminal unit 11A on the circuit board 10A via a wire unit 12A. In the transmission line 14A, the resonant pattern 15A having a symmetric shape with respect to the direction of the transmission line 14A, e.g. a circular shape, is provided. By this resonant pattern 15A, impedance matching of the transmission line 14A is achieved, which makes it possible to reduce reflection of the millimeter-wave electrical signal. The substrate 17A converts the millimeter-wave electrical signal to an electromagnetic wave signal D1 by the antenna part 16A provided at the other end of the transmission line 14A, and outputs the electromagnetic wave signal D1 to the semiconductor device 1B.

The semiconductor device 1B includes a second circuit board (hereinafter, referred to as the circuit board 10B) and a second interposer substrate (hereinafter, referred to as the substrate 17B). The substrate 17B has a second terminal unit (hereinafter, referred to as the terminal unit 13B), a second transmission line (hereinafter, referred to as the transmission line 14B), a second resonant pattern (hereinafter, referred to as the resonant pattern 15B), and a second antenna part (hereinafter, referred to as the antenna part 16B).

The substrate 17B receives the electromagnetic wave signal D1 output from the antenna part 16A by the antenna part 16B, and converts the received signal to a millimeter-wave electrical signal. One end of the transmission line 14B is connected to the antenna part 16B. The transmission line 14B transmits the millimeter-wave electrical signal arising from the conversion by the antenna part 16B in a predetermined direction (in FIG. 17, in the left direction).

In the transmission line 14B, the resonant pattern 15B having a symmetric shape with respect to the transmission line 14B, e.g. a circular shape, is provided. By this resonant pattern 15B, impedance matching of the transmission line 14B is achieved, which makes it possible to reduce reflection of the millimeter-wave electrical signal. The terminal unit 13B is provided at the other end of the transmission line 14B. A wire unit 12B is connected to the terminal unit 13B and to a terminal unit 11B on the circuit board 10B. The millimeter-wave electrical signal transmitted through the transmission line 14B is output from the terminal unit 13B on the substrate 17B to the terminal unit 11B via the wire unit 12B. The circuit board 10B executes signal processing for the millimeter-wave electrical signal output to the terminal unit 11B.

As above, the transmission system 5 according to the fifth embodiment includes the semiconductor devices 1A and 1B having the resonant patterns 15A and 15B in the transmission lines 14A and 14B, respectively. Due to this configuration, impedance matching of the transmission lines 14A and 14B is achieved by the resonant patterns 15A and 15B, and these transmission lines 14A and 14B transmit the electrical signal. Thus, the transmission system 5 capable of high-speed data transmission involving little signal deterioration can be provided.

Although the present embodiment relates to the transmission system that transmits the millimeter-wave electrical signal from the semiconductor device 1A to the semiconductor device 1B, the transmission system may be so configured that the millimeter-wave electrical signal is transmitted from the semiconductor device 1B to the semiconductor device 1A.

Sixth Embodiment

[Configuration Example of Transmission System 6]

The present embodiment relates to a transmission system 6 obtained by providing a dielectric transmission path 40 in the above-described transmission system 5 for transmitting a millimeter-wave between semiconductor devices. In this embodiment, the component having the same name and symbol as those of the component in the above-described fifth embodiment has the same function, and therefore description thereof is omitted.

Figure 19:
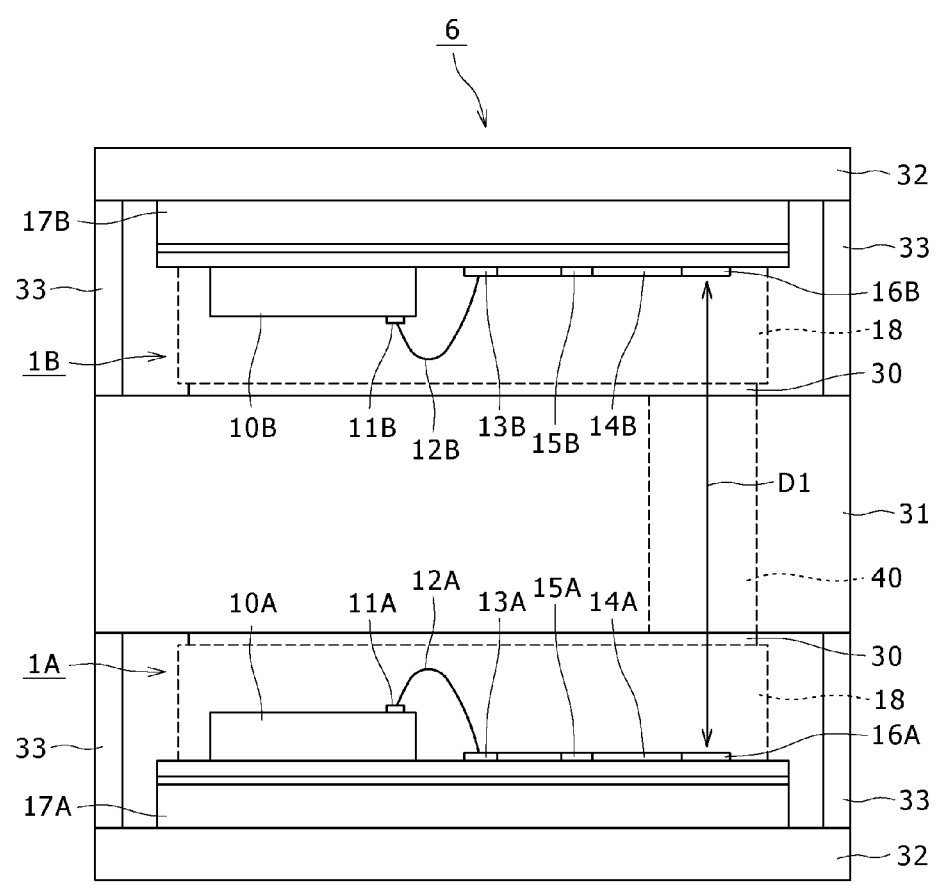
FIG. 19 is a side view showing a configuration example of a transmission system according to a sixth embodiment of the present invention.

As shown in FIG. 19, the transmission system 6 includes semiconductor devices 1A and 1B and the dielectric transmission path 40. A chassis 31 is provided between the semiconductor device 1A and the semiconductor device 1B. The chassis 31 has a function to fix the semiconductor devices 1A and 1B to predetermined positions. The chassis 31 is formed by using e.g. an electrically-insulating material such as a resin. The dielectric transmission path 40 is provided inside the chassis 31, and the dielectric transmission path 40 is located above an antenna part 16A of the semiconductor device 1A and below an antenna part 16B of the semiconductor device 1B. The dielectric transmission path 40 has a predetermined dielectric constant and is provided by using e.g. any of an acrylic resin-based, urethane resin-based, epoxy resin-based, silicone-based, and polyimide-based dielectric materials.

Viscoelastic members 30 are provided between the semiconductor devices 1A and 1B and the chassis 31. The viscoelastic member 30 has a predetermined dielectric constant and is provided by using e.g. any of an acrylic resin-based, urethane resin-based, epoxy resin-based, silicone-based, and polyimide-based dielectric materials. It is preferable that the viscoelastic member 30 be composed of the same material as that of the dielectric transmission path 40.

As described above for the fifth embodiment, an electromagnetic wave signal D1 is output from the antenna part 16A on a substrate 17A. In the present embodiment, the viscoelastic member 30 and the dielectric transmission path 40 are provided above the antenna part 16A with the intermediary of a sealing resin 18. The electromagnetic wave signal D1 output from the antenna part 16A passes through the viscoelastic member 30 and the dielectric transmission path 40 and is received by the antenna part 16B on a substrate 17B.

[Assembly Example of Transmission System 6]

A method for manufacturing the transmission system 6 will be described below. The method is based on the premise that the semiconductor devices 1A and 1B are fabricated by the method for manufacturing the semiconductor device 1, described with FIGS. 7 to 9.

Figure 20:
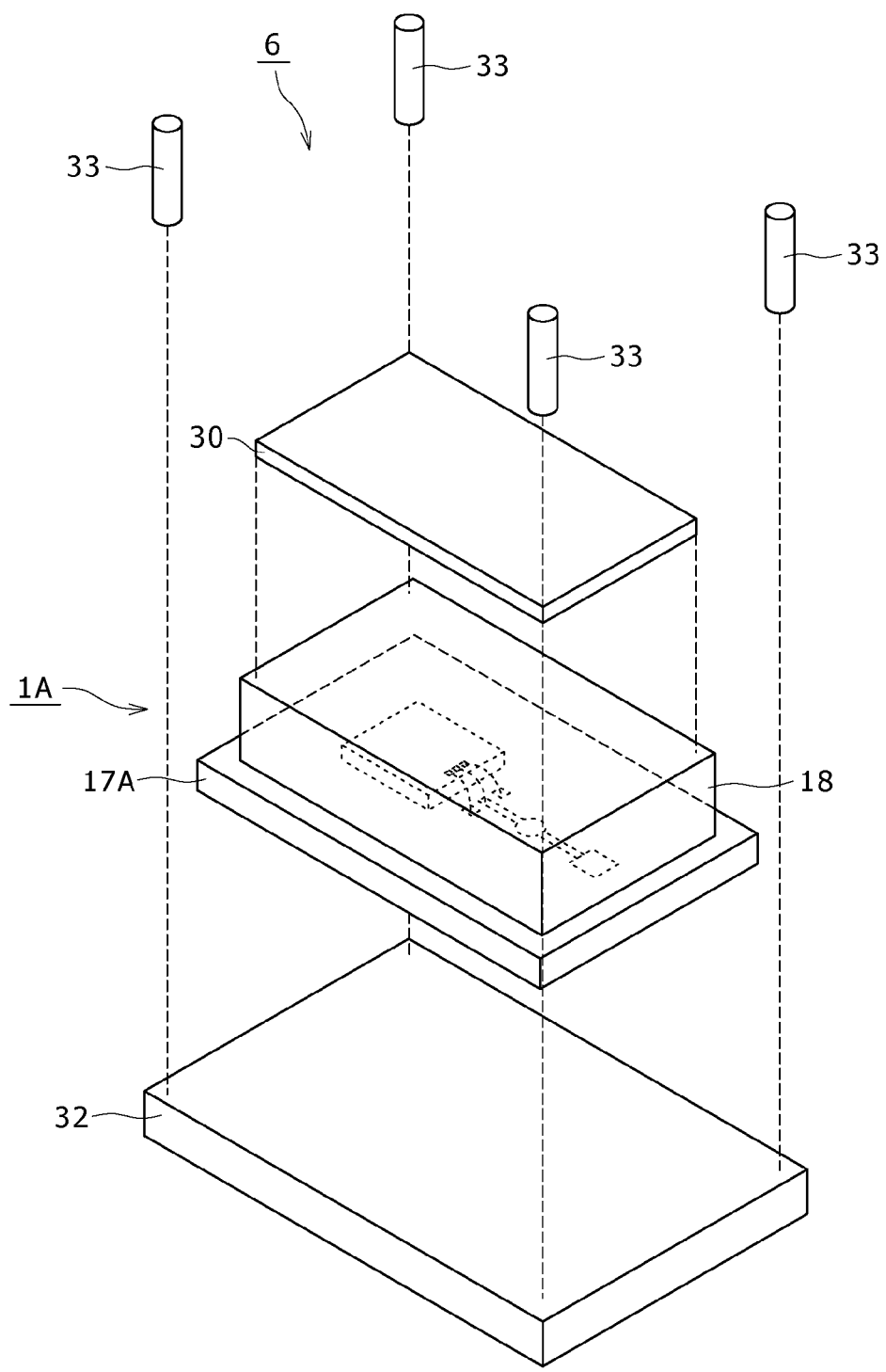
FIG. 20 is an exploded perspective view showing an assembly example of the transmission system.

As shown in FIG. 20, for the manufacturing of the transmission system 6, an adhesive (not shown) is applied on the lower part of the substrate 17A of the semiconductor device 1A and a support substrate 32 is set, to thereby fix the semiconductor device 1A and the support substrate 32. Furthermore, an adhesive is applied on the bottom surfaces of support pillars 33 and the support pillars 33 are provided upright and fixed at four corners of the upper surface of the support substrate 32. The viscoelastic member 30 is placed on the sealing resin 18 for sealing the substrate 17A. An adhesive may be provided between the viscoelastic member 30 and the sealing resin 18. However, it is preferable to use, as this adhesive, an adhesive composed of the same material as that of the viscoelastic member 30.

Figure 21:
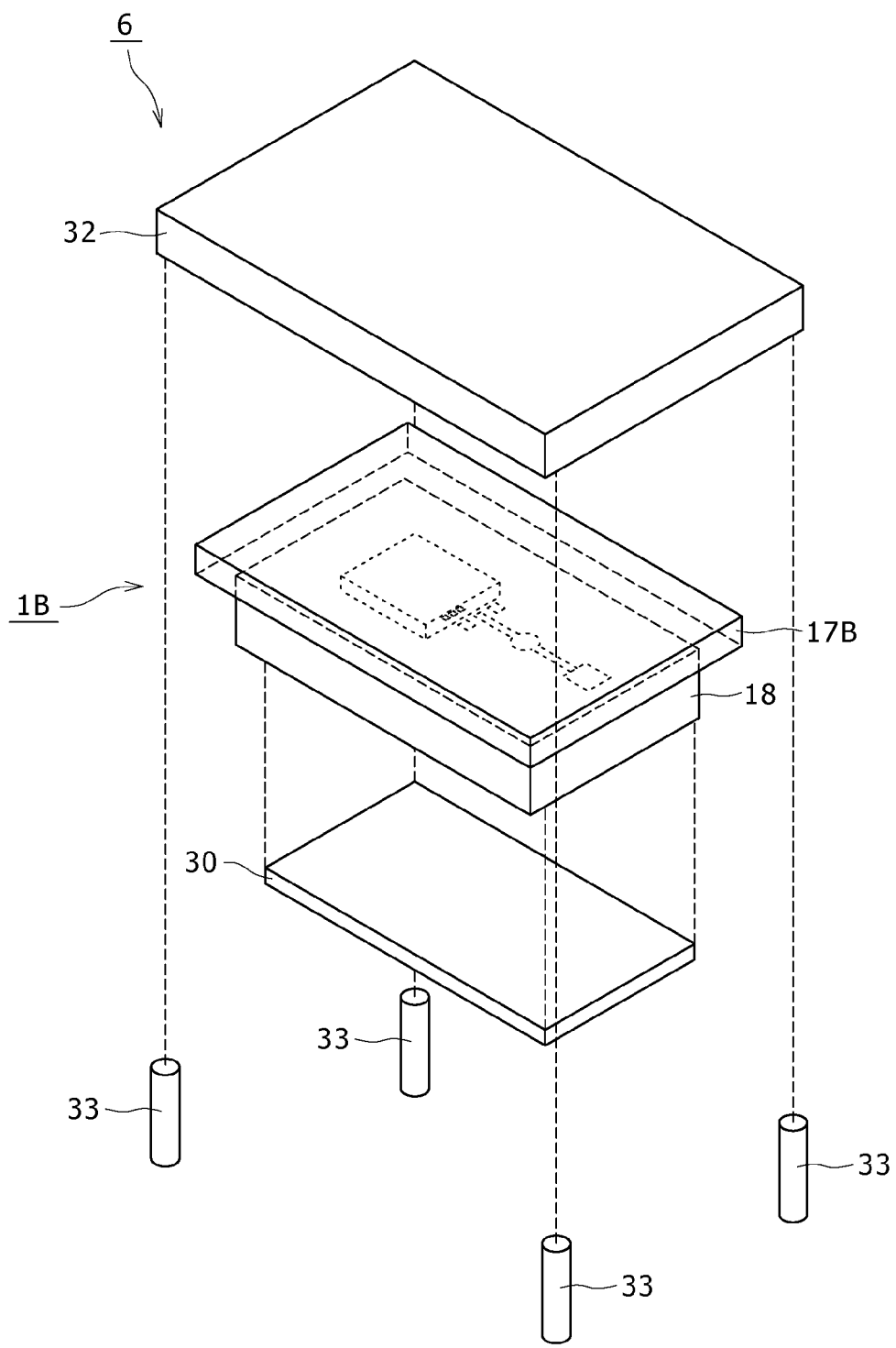
FIG. 21 is an exploded perspective view showing the assembly example of the transmission system.

As shown in FIG. 21, an adhesive (not shown) is applied on the upper part of the substrate 17B of the semiconductor device 1B and the support substrate 32 is set, to thereby fix the semiconductor device 1B and the support substrate 32. Furthermore, an adhesive is applied on the upper surfaces of the support pillars 33 and the support pillars 33 are provided upright and fixed at four corners of the lower surface of the support substrate 32. The viscoelastic member 30 is placed under the sealing resin 18 of the semiconductor device 1B. An adhesive may be provided between the viscoelastic member 30 and the sealing resin 18 similarly to the above-described semiconductor device 1A.

Figure 22:
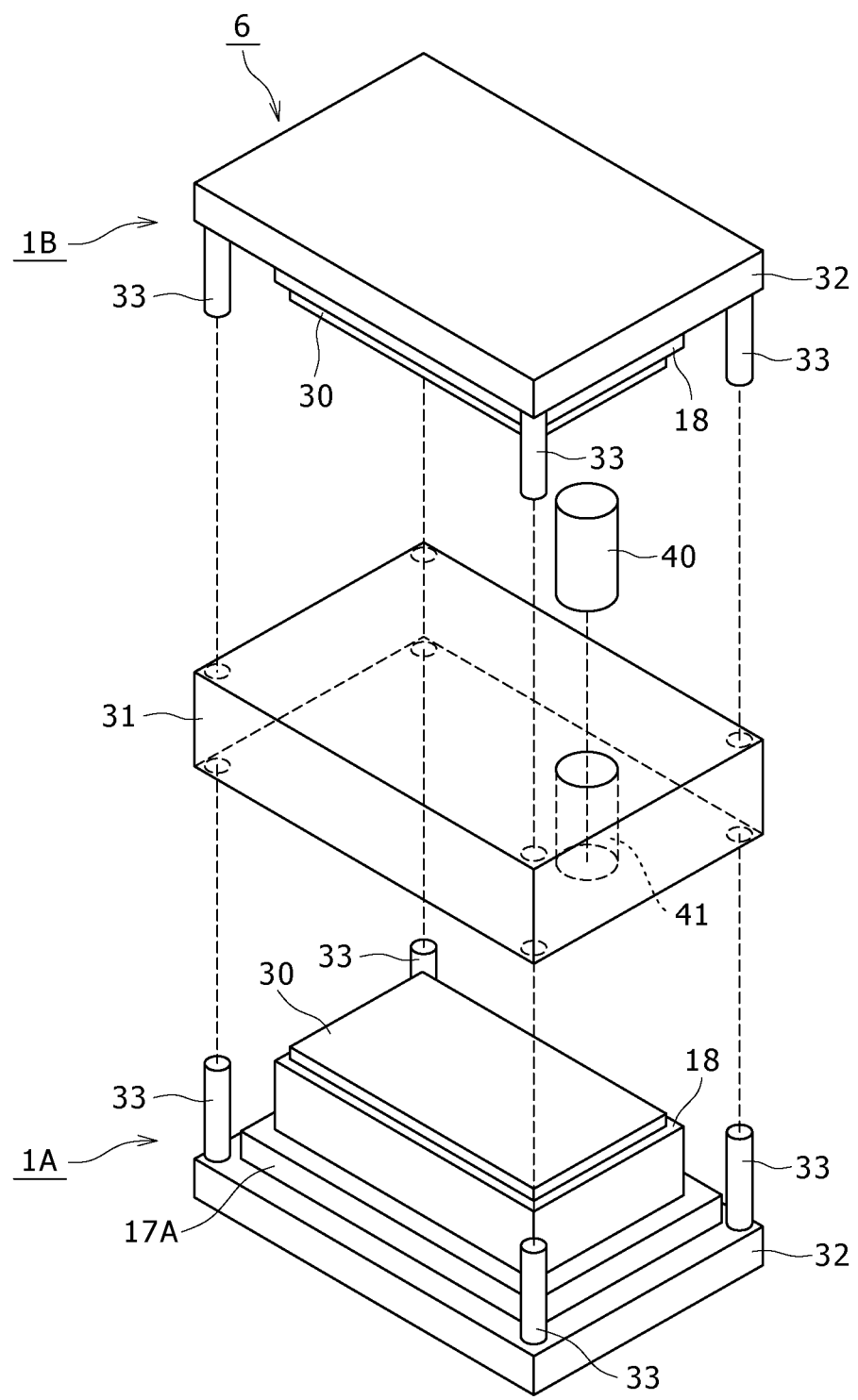
FIG. 22 is an exploded perspective view showing the assembly example of the transmission system.
Figure 23:
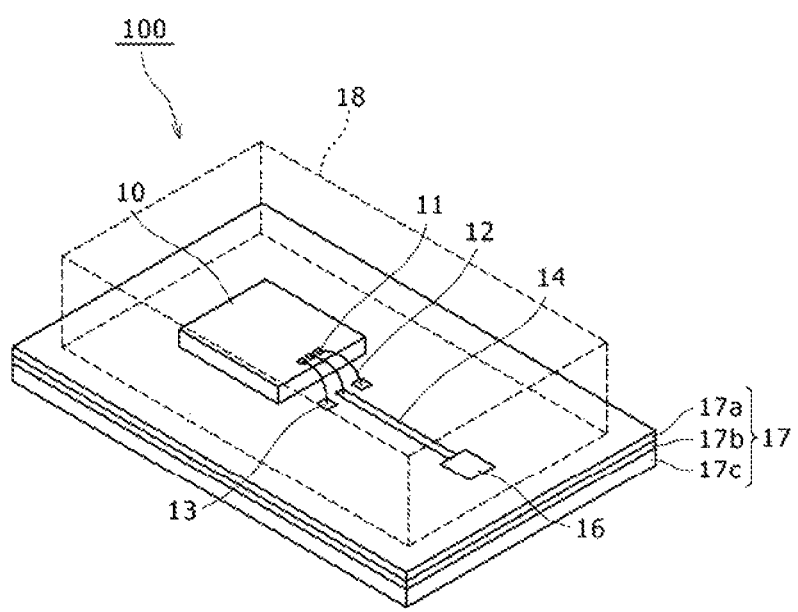
FIG. 23 is a perspective view showing a configuration example of a semiconductor device of a related art.
Figure 24:
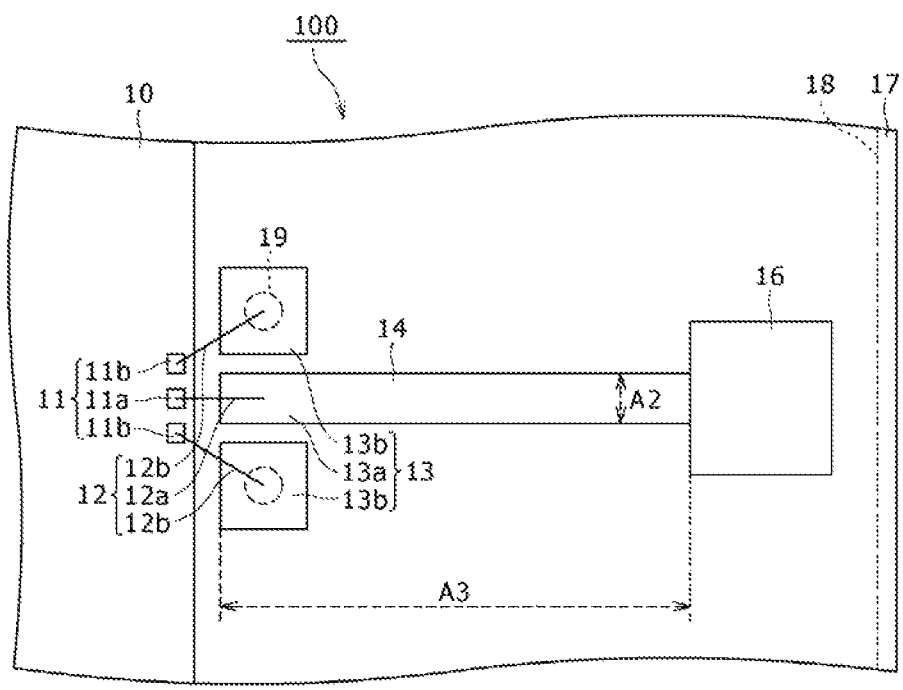
FIG. 24 is a plan view showing a configuration example of a major part of the semiconductor device.
Figure 25:
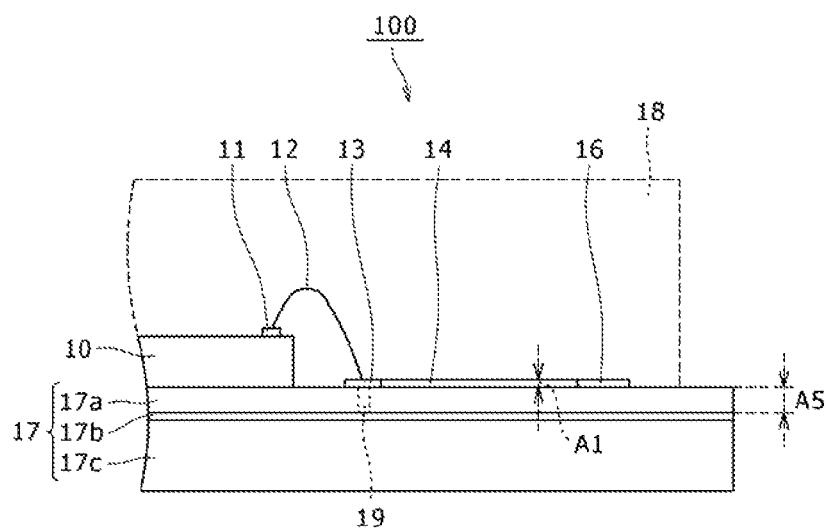
FIG. 25 is a side view showing the configuration example of the major part of the semiconductor device.

As shown in FIG. 22, a hole 41 is made at a predetermined place of the chassis 31 (place opposed to the antenna parts 16A and 16B of the semiconductor devices 1A and 1B) and the dielectric transmission path 40 is inserted therein. The chassis 31 is provided between the semiconductor device 1A described with FIG. 20 and the semiconductor device 1B described with FIG. 21. An adhesive is applied between the support pillars 33 provided for the semiconductor devices 1A and 1B and the chassis 31, and the semiconductor devices 1A and 1B and the chassis 31 are fixed. An adhesive may be applied between the viscoelastic members 30 provided for the semiconductor devices 1A and 1B and the chassis 31. In this case, it is preferable to use, as this adhesive, an adhesive composed of the same material as that of the viscoelastic members 30. In this manner, the transmission system 6 shown in FIG. 19 is fabricated.

As above, the transmission system 6 according to the sixth embodiment includes the dielectric transmission path 40 and the viscoelastic members 30 between the semiconductor devices 1A and 1B, and thus can transmit the millimeter-wave electrical signal via the dielectric substances.

The present application contains subject matter related to that disclosed in Japanese Priority Patent Application JP 2009-063564 filed in the Japan Patent Office on Mar. 16, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A transmission system, comprising:
a first semiconductor device that includes:
a first semiconductor circuit element configured to process a first electrical signal of a determined frequency;
a first transmission line that is connected to the first semiconductor circuit element via a wire and transmits the first electrical signal; and
a first antenna part configured to convert the first electrical signal transmitted from the first transmission line to an electromagnetic wave signal and sends the electromagnetic wave signal;
a second semiconductor device that includes:
a second antenna part configured to receive the electromagnetic wave signal sent from the first antenna part and convert the electromagnetic wave signal to a second electrical signal of the determined frequency;
a second transmission line configured to transmit the second electrical signal from conversion by the second antenna part; and
a second semiconductor circuit element that is connected to the second transmission line via a wire and processes the second electrical signal transmitted by the second transmission line; and
a dielectric transmission path between the first semiconductor device and the second semiconductor device, wherein the dielectric transmission path has a determined dielectric constant and is configured to transmit the first electrical signal from the first semiconductor device to the second semiconductor device,
wherein impedance matching patterns are provided in the first and second transmission lines,
wherein the impedance matching patterns have symmetric shapes with respect to directions of transmission of the first and second electrical signals.

2. The transmission system according to claim 1, wherein a viscoelastic member with a determined dielectric constant is present between each of the first and second semiconductor devices and the dielectric transmission path.

3. The transmission system according to claim 1, wherein the dielectric transmission path is provided by at least one of an acrylic resin-based material, a urethane resin-based material, an epoxy resin-based material, a silicone-based material, or a polyimide-based material.

4. A transmission system, comprising:
a first semiconductor device that includes:
a first semiconductor circuit element configured to process a first electrical signal of a determined frequency;
a first transmission line that is connected to the first semiconductor circuit element via a wire and transmits the first electrical signal; and
a first antenna part configured to convert the first electrical signal transmitted from the first transmission line to an electromagnetic wave signal and sends the electromagnetic wave signal; and
a second semiconductor device that includes:
a second antenna part configured to receive the electromagnetic wave signal sent from the first antenna part and convert the electromagnetic wave signal to a second electrical signal of the determined frequency;
a second transmission line configured to transmit the second electrical signal from conversion by the second antenna part; and
a second semiconductor circuit element that is connected to the second transmission line via a wire and is configured to process the second electrical signal transmitted by the second transmission line,
wherein impedance matching patterns are provided in the first and second transmission lines,
wherein the impedance matching patterns have symmetric shapes with respect to directions of the first and second electrical signals and the determined frequency is in a millimeter-wave band, and
wherein S-parameter magnitudes of transfer characteristics, associated with at least one of the first semiconductor device or the second semiconductor device, are greater than the S-parameter magnitudes of reflection characteristics based on the determined frequency of the first electrical signal or the second electrical signal that lies in a range of about 55 GHz to 65 GHz.

5. A transmission system, comprising:
a first semiconductor device that includes:
- a first semiconductor circuit element configured to process a first electrical signal of a determined frequency;
- a first transmission line that is connected to the first semiconductor circuit element via a wire and transmits the first electrical signal; and
- a first antenna part configured to convert the first electrical signal transmitted from the first transmission line to an electromagnetic wave signal and sends the electromagnetic wave signal; and a second semiconductor device that includes:
- a second antenna part configured to receive the electromagnetic wave signal sent from the first antenna part and convert the electromagnetic wave signal to a second electrical signal of the determined frequency;
- a second transmission line configured to transmit the second electrical signal from conversion by the second antenna part; and
- a second semiconductor circuit element that is connected to the second transmission line via a wire and is configured to process the second electrical signal transmitted by the second transmission line, wherein,
impedance matching patterns are provided in the first and second transmission lines,
the impedance matching patterns have symmetric shapes with respect to directions of the first and second electrical signals,
a plurality of grounding electrodes are present for the transmission line, and wherein, the plurality of grounding electrodes are present symmetrically with respect to the direction of the transmission line, and
wherein S-parameter magnitudes of transfer characteristics, associated with at least one of the first semiconductor device or the second semiconductor device, are greater than the S-parameter magnitudes of reflection characteristics based on the determined frequency of the first electrical signal or the second electrical signal that lies in a range of about 55 GHz to 65 GHz.

6. The transmission system of claim 1, wherein the determined frequency of the first electrical signal lies in a range of 40 GHz to 80 GHz.

7. The transmission system of claim 1, wherein the determined frequency of the first electrical signal is about 60 GHz.

8. The transmission system of claim 1, wherein S-parameter magnitudes of transfer characteristics associated with at least one of the first semiconductor device or the second semiconductor device is about −3 dB based on the determined frequency of the first electrical signal or the second electrical signal that is about 60 GHz.

* * * * *